United States Patent
Greywall

(10) Patent No.: US 6,850,354 B2
(45) Date of Patent: Feb. 1, 2005

(54) MONOLITHIC MEMS DEVICE FOR OPTICAL SWITCHES

(75) Inventor: Dennis S. Greywall, Whitehouse Station, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 10/261,089

(22) Filed: Sep. 30, 2002

(65) Prior Publication Data

US 2004/0061924 A1 Apr. 1, 2004

(51) Int. Cl.[7] .......................... G02B 26/08; G02B 26/00
(52) U.S. Cl. .................... 359/291; 359/214; 359/224
(58) Field of Search .................. 359/214, 223, 359/224, 290, 291, 298; 310/36, 309; 348/205; 257/415

(56) References Cited

U.S. PATENT DOCUMENTS

| | | | |
|---|---|---|---|
| 5,501,893 A | 3/1996 | Laermer et al. | 428/161 |
| 5,629,790 A | 5/1997 | Neukermans et al. | 359/198 |
| 6,093,330 A * | 7/2000 | Chong et al. | 216/2 |
| 6,122,090 A | 9/2000 | Kino et al. | |
| 6,201,631 B1 | 3/2001 | Greywall | 359/245 |
| 6,321,010 B1 | 11/2001 | Walker et al. | 385/49 |
| 6,337,760 B1 | 1/2002 | Huibers et al. | |
| 6,351,329 B1 | 2/2002 | Greywall | 359/290 |
| 6,356,689 B1 | 3/2002 | Greywall | 385/52 |
| 6,369,374 B1 | 4/2002 | Greywall | 250/201.1 |
| 6,388,789 B1 | 5/2002 | Bernstein | 359/198 |
| 6,445,362 B1 | 9/2002 | Tegreene | 345/7 |
| 6,535,663 B1 | 3/2003 | Chertkow | 385/18 |
| 6,541,831 B2 * | 4/2003 | Lee et al. | 257/415 |
| 6,590,267 B1 | 7/2003 | Goodwin-Johansson et al. | 257/415 |
| 6,590,313 B2 | 7/2003 | Agrawal et al. | 310/307 |
| 6,600,591 B2 * | 7/2003 | Anderson et al. | 359/291 |
| 6,667,823 B2 | 12/2003 | Greywall | 359/224 |
| 6,695,457 B2 * | 2/2004 | van Drieenhuizen et al. | 359/872 |
| 2002/0011759 A1 * | 1/2002 | Adams et al. | 310/309 |
| 2002/0018334 A1 | 2/2002 | Hill et al. | 361/278 |
| 2002/0135864 A1 * | 9/2002 | Chiu et al. | 359/318 |
| 2002/0163051 A1 * | 11/2002 | Gopal et al. | 257/414 |
| 2003/0117152 A1 | 6/2003 | Murphy | 324/661 |
| 2003/0169928 A1 | 9/2003 | Stanek | 382/232 |
| 2004/0061414 A1 | 4/2004 | Greywall | 310/309 |
| 2004/0061619 A1 | 4/2004 | Kim et al. | 340/686.1 |

FOREIGN PATENT DOCUMENTS

JP          09159938 A    6/1997

\* cited by examiner

*Primary Examiner*—Georgia Epps
*Assistant Examiner*—William Choi

(57) ABSTRACT

A MEMS device for an optical switch may be fabricated using a single wafer, which alleviates the alignment problem associated with a two-piece prior art design. The device has a movable plate, which may act as a mirror, supported on a stationary substrate. The plate rotates with respect to the substrate in response to a voltage applied to a stationary electrode rigidly connected to the substrate. Additional movable and/or stationary electrodes may be implemented to enable bidirectional rotation of the plate. Electrodes may be arranged with respect to each other and/or the plate to form a fringe-field (FF) actuator, which may alleviate the snap-down problem associated with the prior art design. Multiple MEMS devices of the invention may be arrayed in a single integrated structure to form a linear, radial, or two-dimensional array of mirrors.

20 Claims, 23 Drawing Sheets

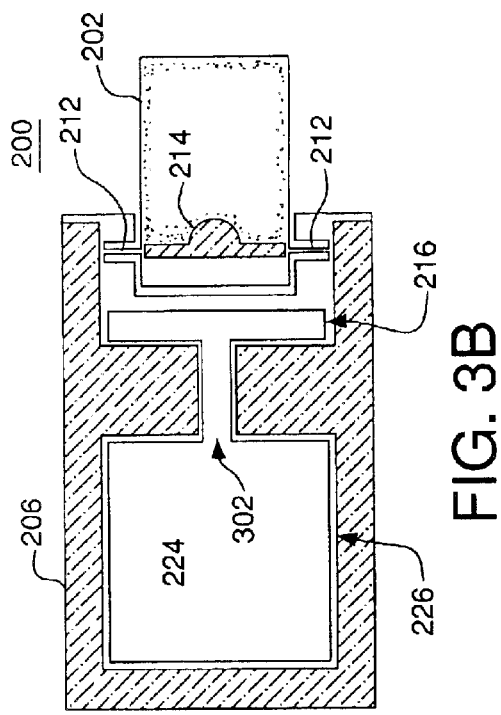
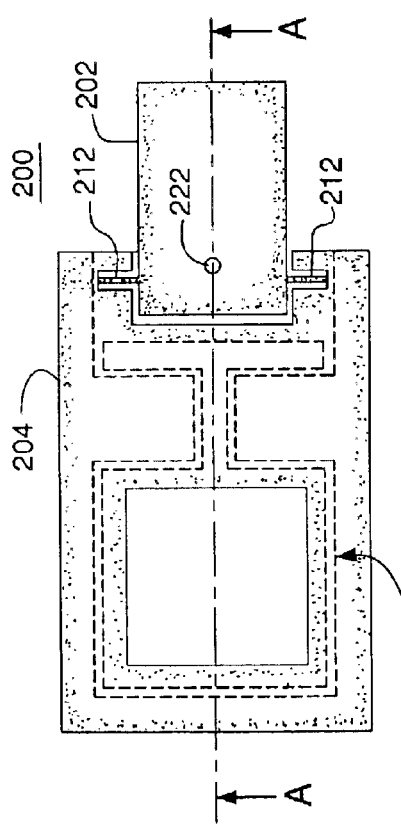
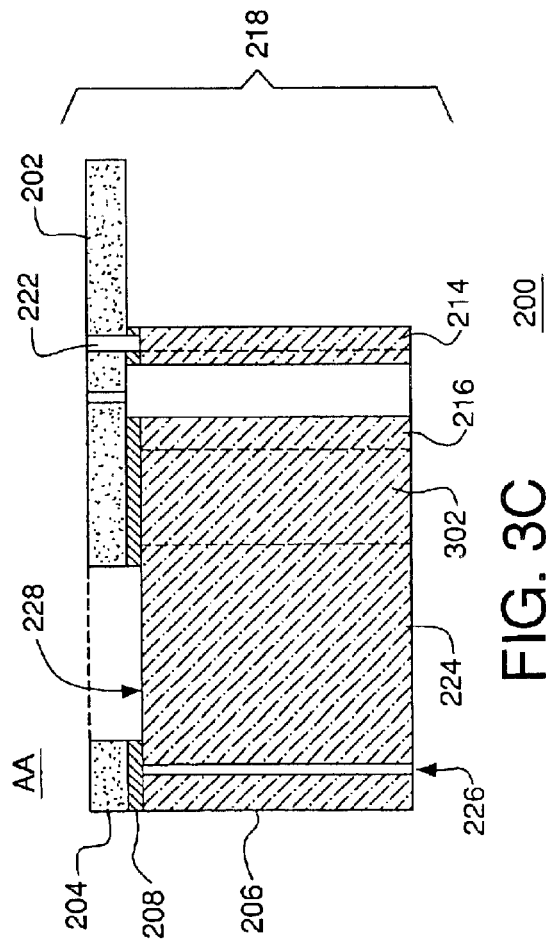
FIG. 3A
FIG. 3B
FIG. 3C

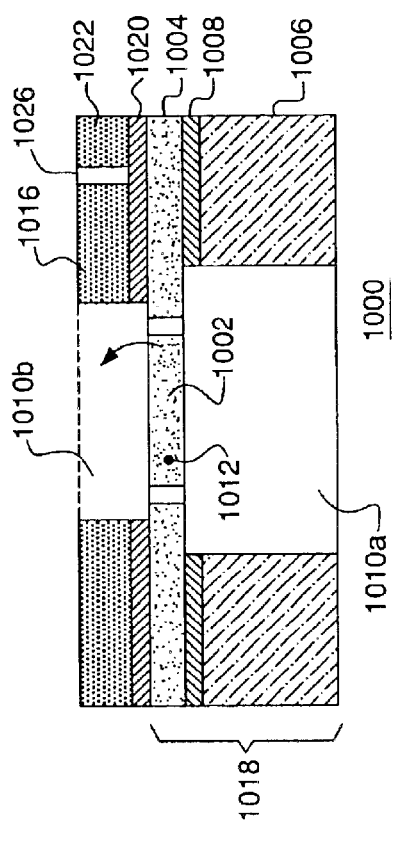
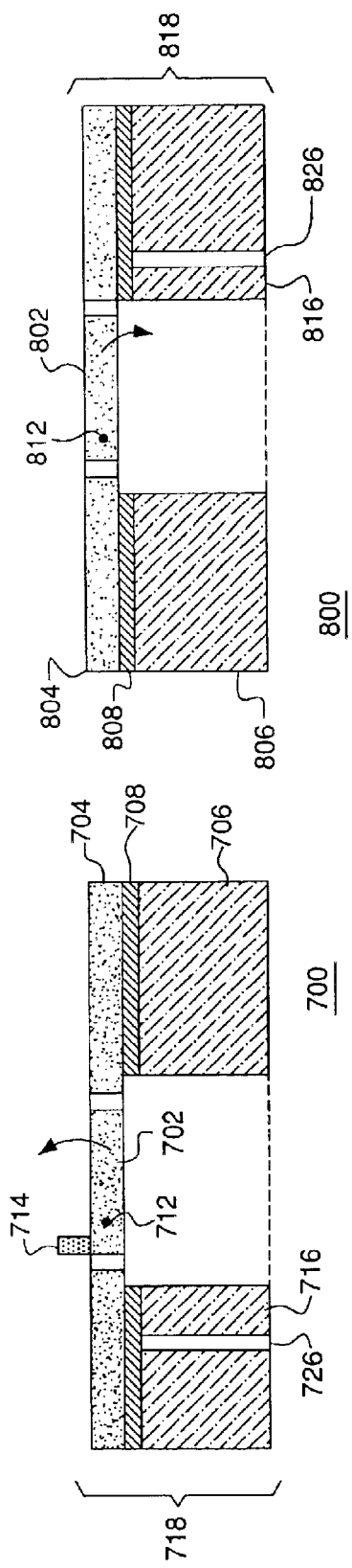
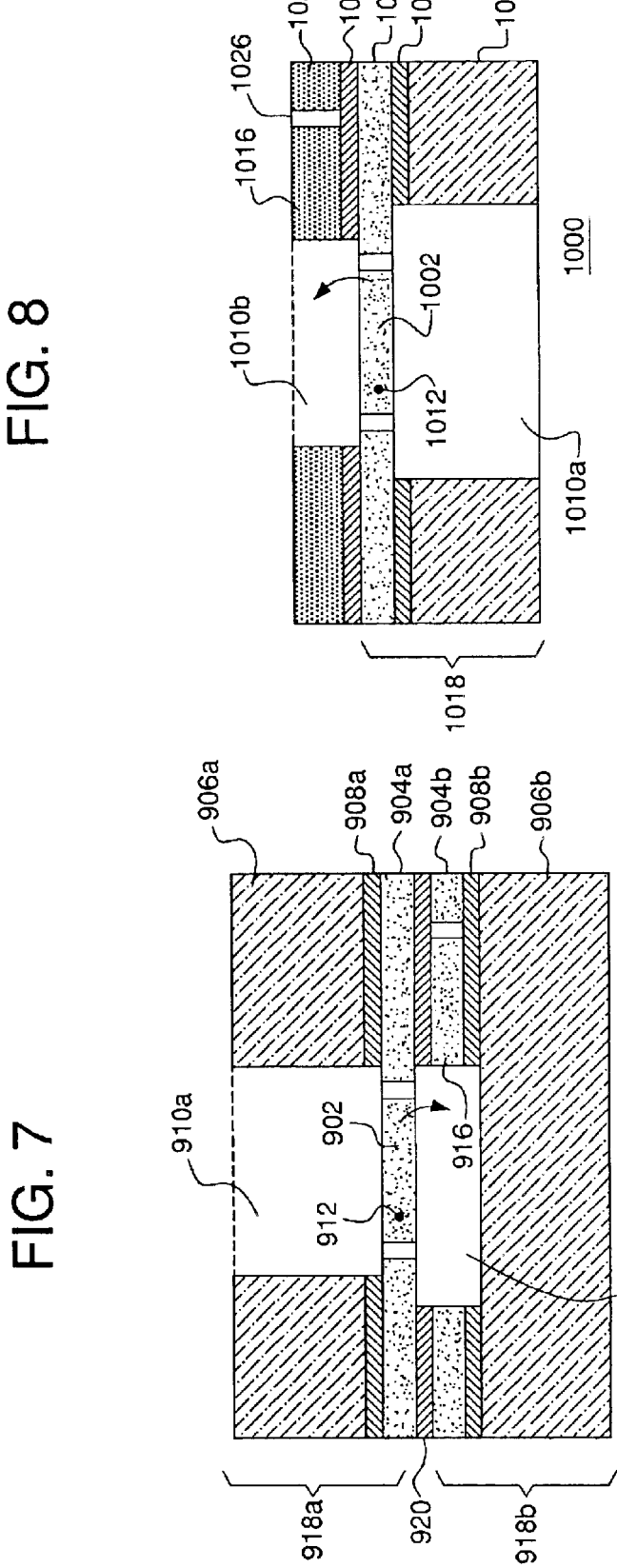
FIG. 7
FIG. 8
FIG. 9
FIG. 10

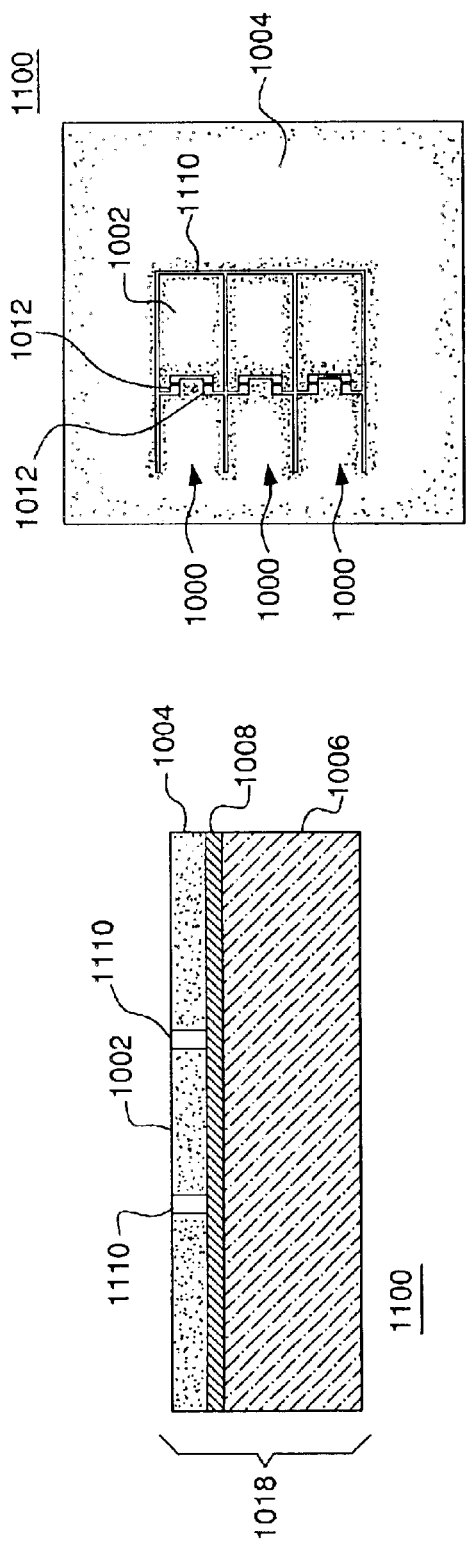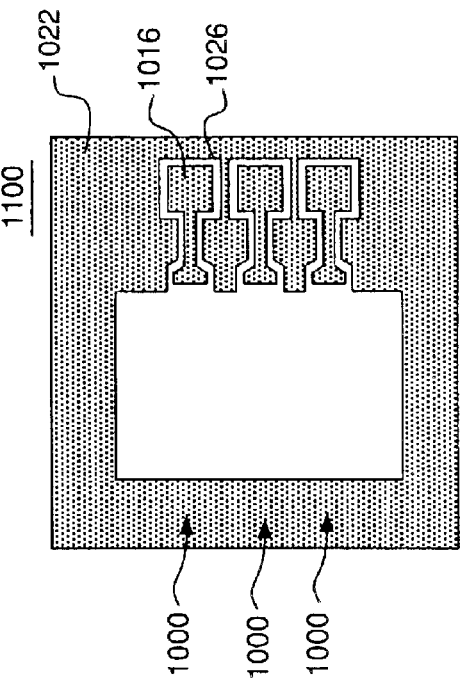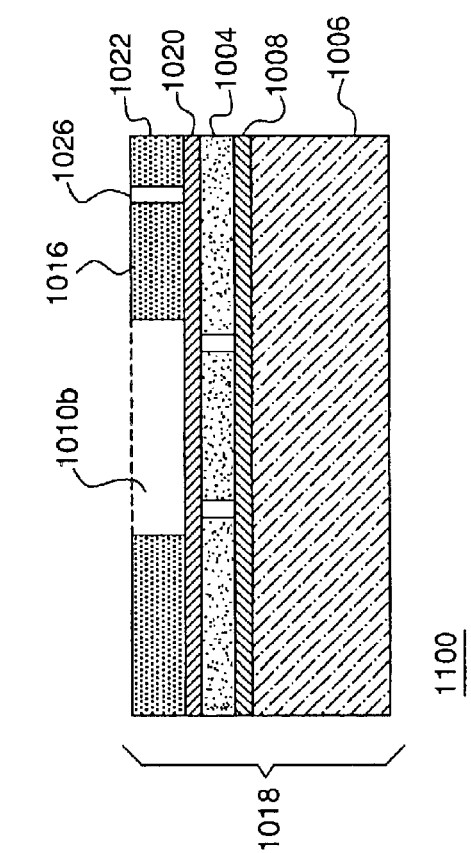
FIG. 11A FIG. 11B FIG. 11C FIG. 11D

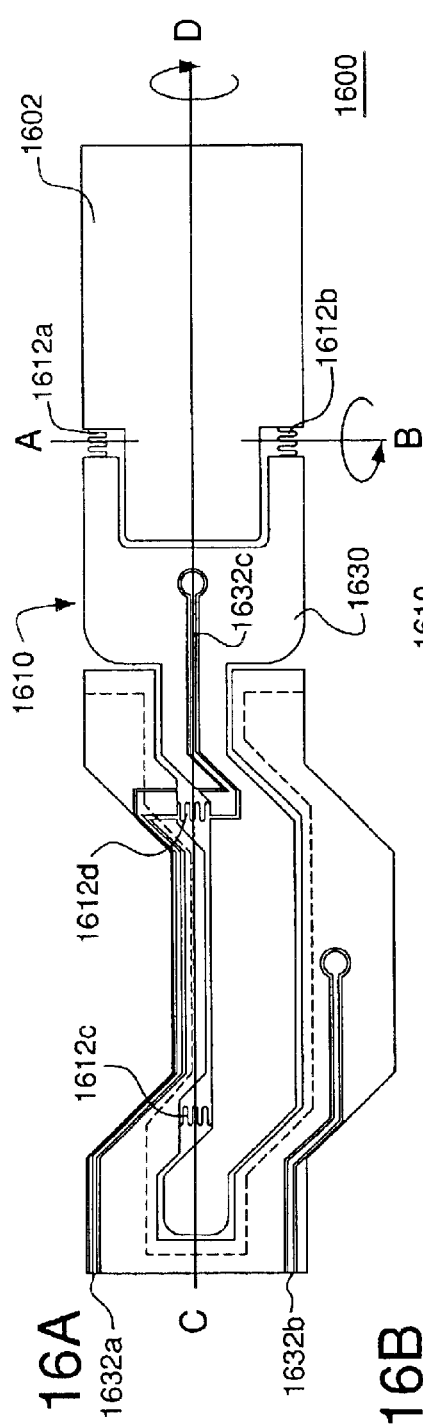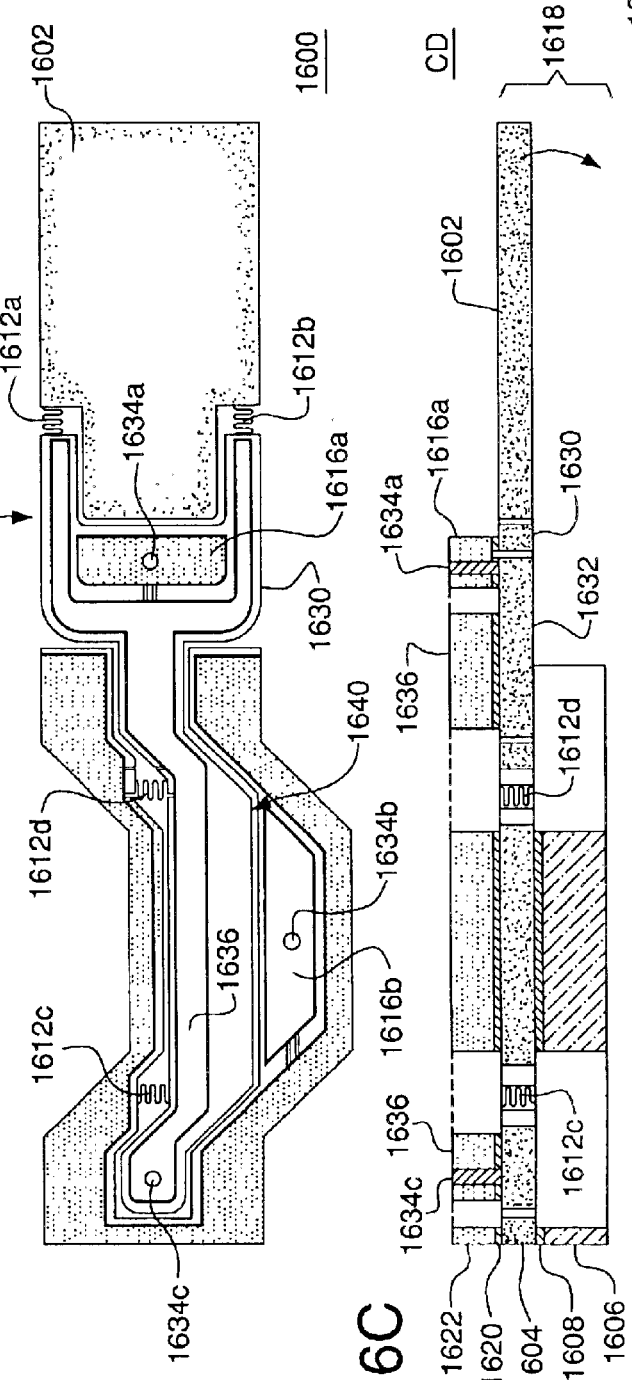
FIG. 16A
FIG. 16B
FIG. 16C

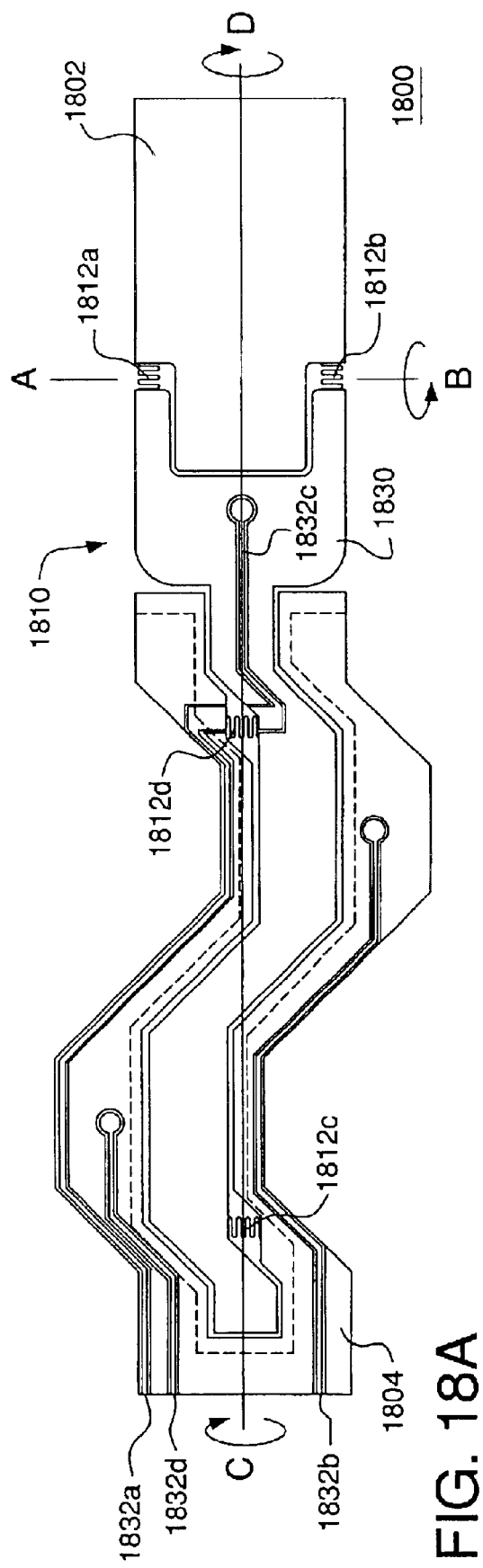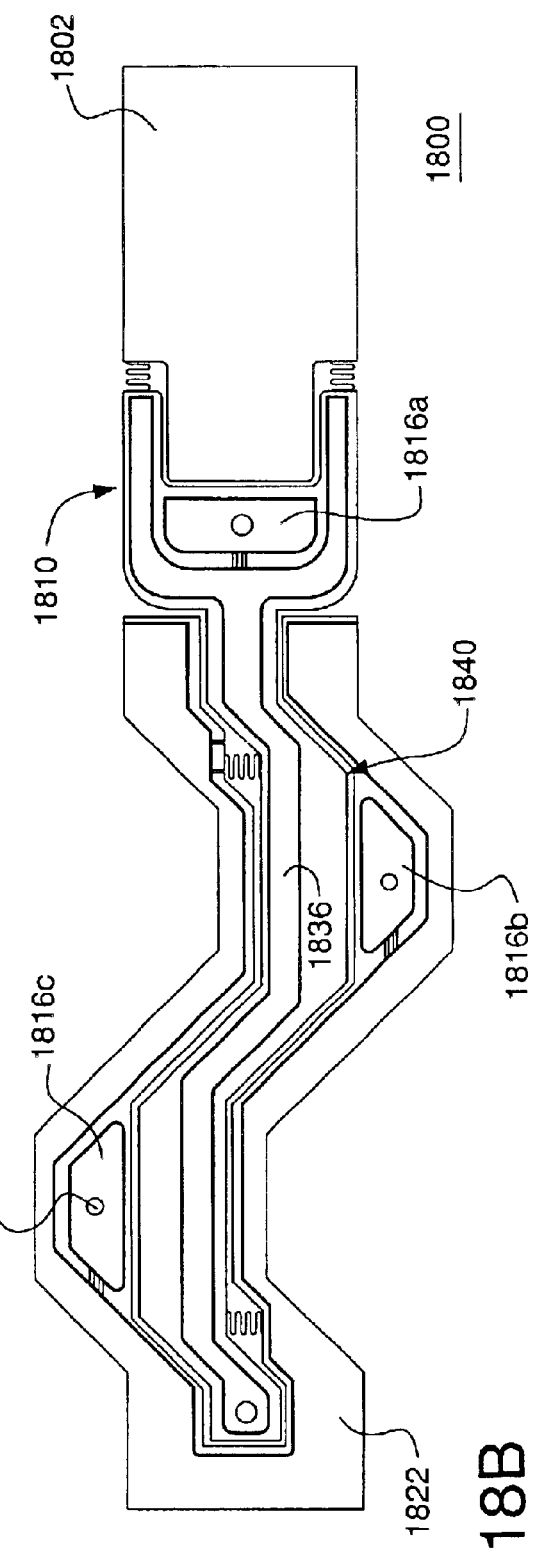
FIG. 18A
FIG. 18B

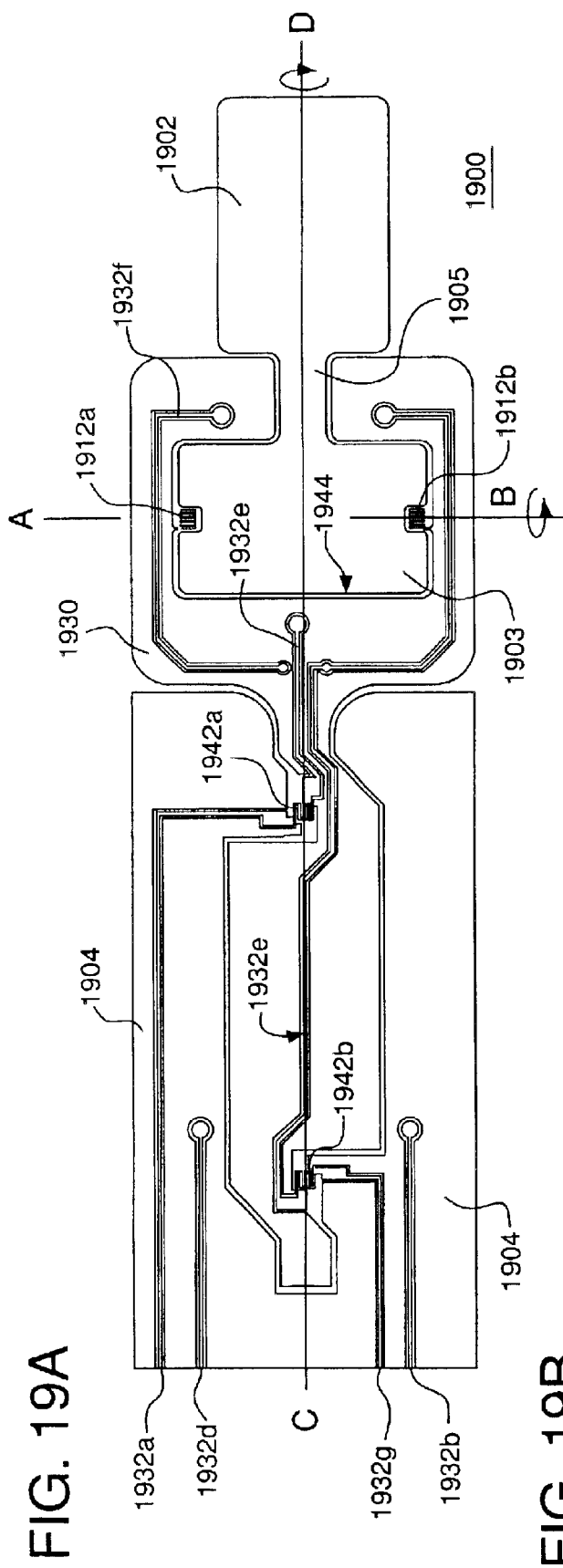
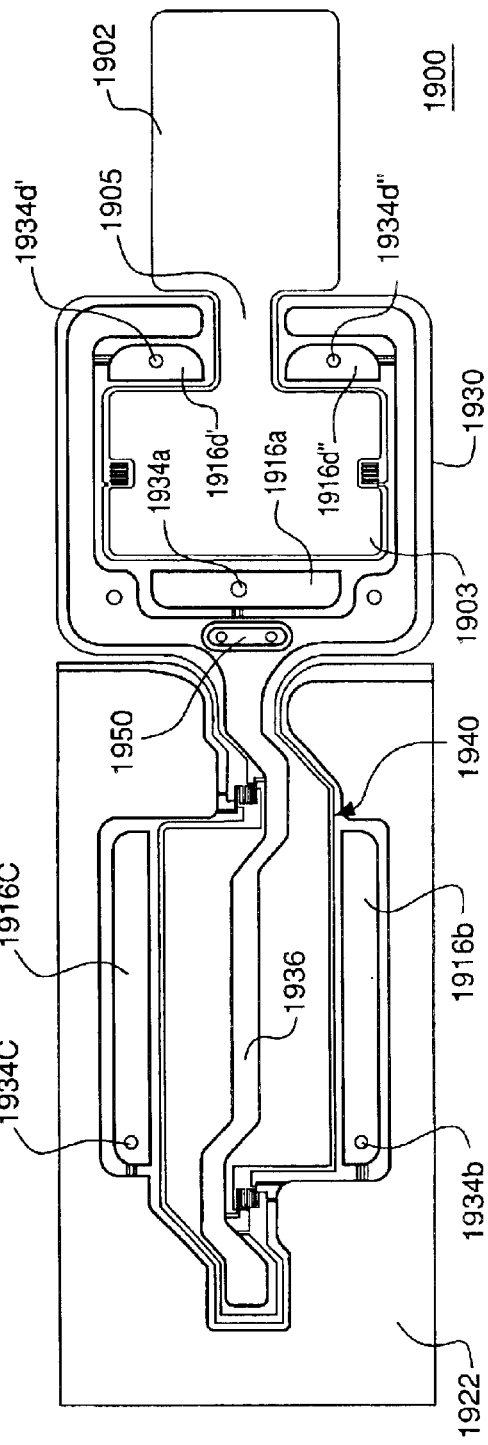
FIG. 19A
FIG. 19B

MONOLITHIC MEMS DEVICE FOR OPTICAL SWITCHES

CROSS REFERENCE TO RELATED APPLICATIONS

The subject matter of this application is related to that of U.S. patent application Ser. No. 10/001,182, filed Dec. 1, 2001, and entitled "A Micro-Electrical-Mechanical System (MEMS) Device and a Method of Manufacture Therefor," the teachings of which are incorporated herein by reference. This application is one of a set of U.S. patent applications consisting of Ser. No. 10/261,089 filed as attorney docket no. Greywall 23, Ser. No. 10/261,088 filed as attorney docket no. Greywall 25, and Ser. No. 10/261,087 filed as attorney docket No. Greywall 26, all of which were filed on the same date and the teachings of all of which are incorporated herein by reference.

BACKGROUND OF THE INVENTION

1. Field of the Invention

The invention relates to optical communication equipment and, more specifically, to micro-electromechanical devices for use in such equipment.

2. Description of the Related Art

Optical communication equipment often employs micro-electromechanical systems (MEMS). A typical MEMS system may include an array of micro-machined mirrors, each mirror individually movable in response to an electrical signal. Such an array may be employed as an element of an optical cross-connect. In operation, at least one mirror in the array receives a beam of light. The beam is reflected from the mirror and can be controllably redirected to a different location by rotating the mirror. More details on the principle of operation and methods of manufacture of MEMS devices including mirror arrays may be found, for example, in commonly assigned U.S. Pat. No. 6,201,631, the teachings of which are incorporated herein by reference.

One problem with prior art MEMS devices is related to manufacturing such devices. During fabrication, two pieces, e.g., wafers, which are used to form the MEMS device must be accurately aligned to properly position the actuating electrodes with respect to the corresponding mirror. Such alignment may be difficult to achieve for relatively small mirrors and/or mirror arrays having a relatively large number of mirrors.

Another problem with prior art MEMS devices is referred to as "snap-down." More specifically, when the voltage applied to an actuating electrode in such device approaches a critical value, the tilt angle of the mirror begins to increase rapidly and nonlinearly with the voltage. This behavior may cause a collision of the mirror against the electrode and/or wafer, damaging the mirror and rendering the MEMS device inoperable.

SUMMARY OF THE INVENTION

The problems in the prior art are addressed, in accordance with the principles of the invention, by a MEMS device fabricated from only a single wafer, which alleviates the alignment problem associated with a two-piece prior art design. The MEMS device is preferably fabricated using a silicon-on-insulator (SOI) wafer and etch fabrication technique.

The MEMS device has a stationary part and a movable part movably coupled to the stationary part. The movable part is adapted to move relative to the stationary part in response to a first voltage applied between the movable part and a first electrode rigidly connected to the stationary part.

In one embodiment, the wafer has at least three layers: a first layer, a second layer formed over the first layer, and a third layer formed over the second layer. The stationary part and the first electrode are formed in the first layer, the second layer electrically insulates the first layer from the third layer, and the movable part is formed in the third layer.

In another embodiment, the movable part is adapted to move relative to the stationary part in response to the first voltage applied between the first electrode and a second electrode rigidly connected to the movable part.

In yet another embodiment, the movable part is adapted to move relative to the stationary part in a direction different from the motion imparted by the first voltage applied between the first electrode and the movable part, in response to a second voltage applied between the movable part and a third electrode rigidly connected to the stationary part.

In yet another embodiment, the MEMS device is part of an integrated device having two or more MEMS devices that are radially arrayed with their respective movable parts forming different sections of a segmented plate.

BRIEF DESCRIPTION OF THE DRAWINGS

FIGS. 3A–C illustrate top, bottom, and cross-sectional views, respectively, of the switch shown in FIG. 2;

FIG. 7 illustrates a cross-sectional view of an optical switch driven by fringe-field actuation according to one embodiment of the invention;

FIG. 8 illustrates a cross-sectional view of an optical switch driven by fringe-field actuation according to another embodiment of the invention;

FIG. 9 illustrates a cross-sectional view of an optical switch driven by fringe-field actuation according to yet another embodiment of the invention;

FIG. 10 illustrates a cross-sectional view of an optical switch driven by fringe-field actuation according to one more embodiment of the invention;

FIGS. 11A–F illustrate representative fabrication steps of an arrayed optical switch having three optical switches of FIG. 10 according to one embodiment of the invention;

FIGS. 16A–C illustrate top and cross-sectional views of a two-axis switch driven by fringe-field actuation according to one embodiment of the invention;

FIGS. 18A–B illustrate top and cross-sectional views, respectively, of a two-axis switch driven by fringe-field actuation according to another embodiment of the invention;

FIGS. 19A–B illustrate cross-sectional and top views, respectively, of a two-axis switch driven by fringe-field actuation according to yet another embodiment of the invention;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Analogous features in different embodiments are often illustrated using labels having the same last two digits.

Prior Art Design

Figure 1B:
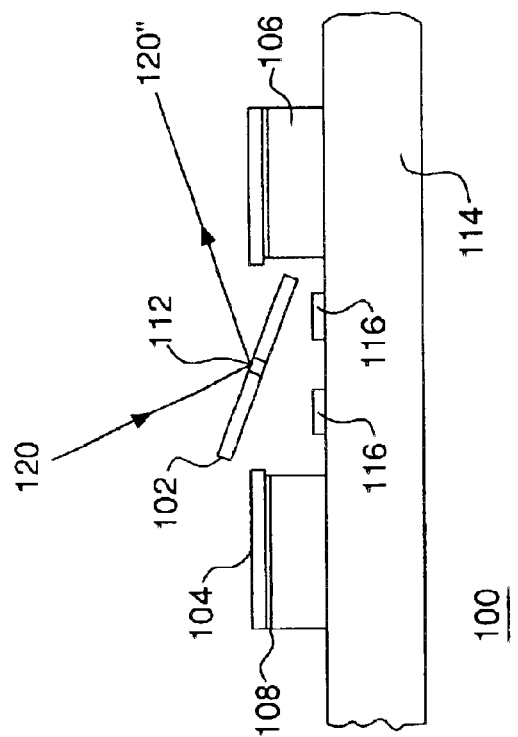
FIGS. 1A–B illustrate cross-sectional views of a representative prior art MEMS device that may be used in an optical cross-connect element.
Figure 1A:
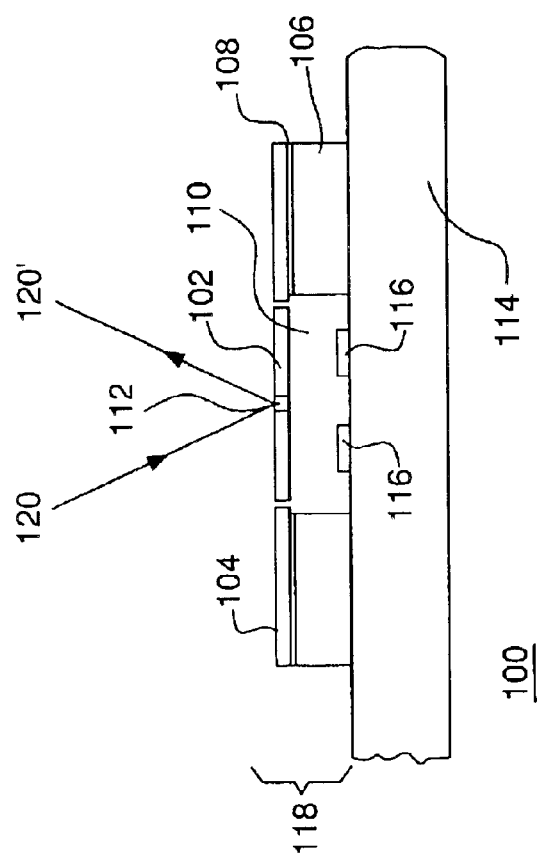

FIG. 1A shows a cross-sectional view of a representative MEMS device 100 of the prior art that may be used in an optical cross-connect element. Device 100 has a movable mirror 102 formed in an overlayer 104 of a wafer 118 using, e.g., reactive etching. Wafer 118 has two additional layers: a substrate layer 106 and a thin insulating layer 108. Layer 108 electrically isolates overlayer 104 from substrate layer 106. Overlayer 104 and substrate layer 106 may be silicon, and insulating layer 108 may be silicon oxide. Mirror 102 is supported above a cavity 110 by a pair of torsional members 112 connected to overlayer 104. Cavity 110 is defined in insulating layer 108 and substrate layer 106. A second wafer 114 includes electrodes 116 as well as electrical interconnections (not shown). Substrate layer 106 is attached to wafer 114 such that electrodes 116 are located beneath mirror 102 in cavity 110. Mirror 102 and electrodes 116 form an actuator of device 100, the configuration of which is similar to the two plates of a parallel-plate capacitor. Hence, this type of actuator is referred to as a parallel-plate actuator.

FIG. 1B illustrates how a beam of light 120 impinging on mirror 102 can be redirected from direction 120' (FIG. 1A) to direction 120" using mirror rotation. Mirror 102 rotates about the axis defined by torsional members 112 in response to voltages applied to electrodes 116. Changing those voltages can change the angle of rotation thus enabling a cross-connecting function of device 100. As seen in FIG. 1B, device 100 is prone to snap-down because, at an appropriately large angle of rotation, mirror 102 may accelerate towards and collide with electrode 116 and/or wafer 114.

Parallel-Plate Actuation

Figure 2:
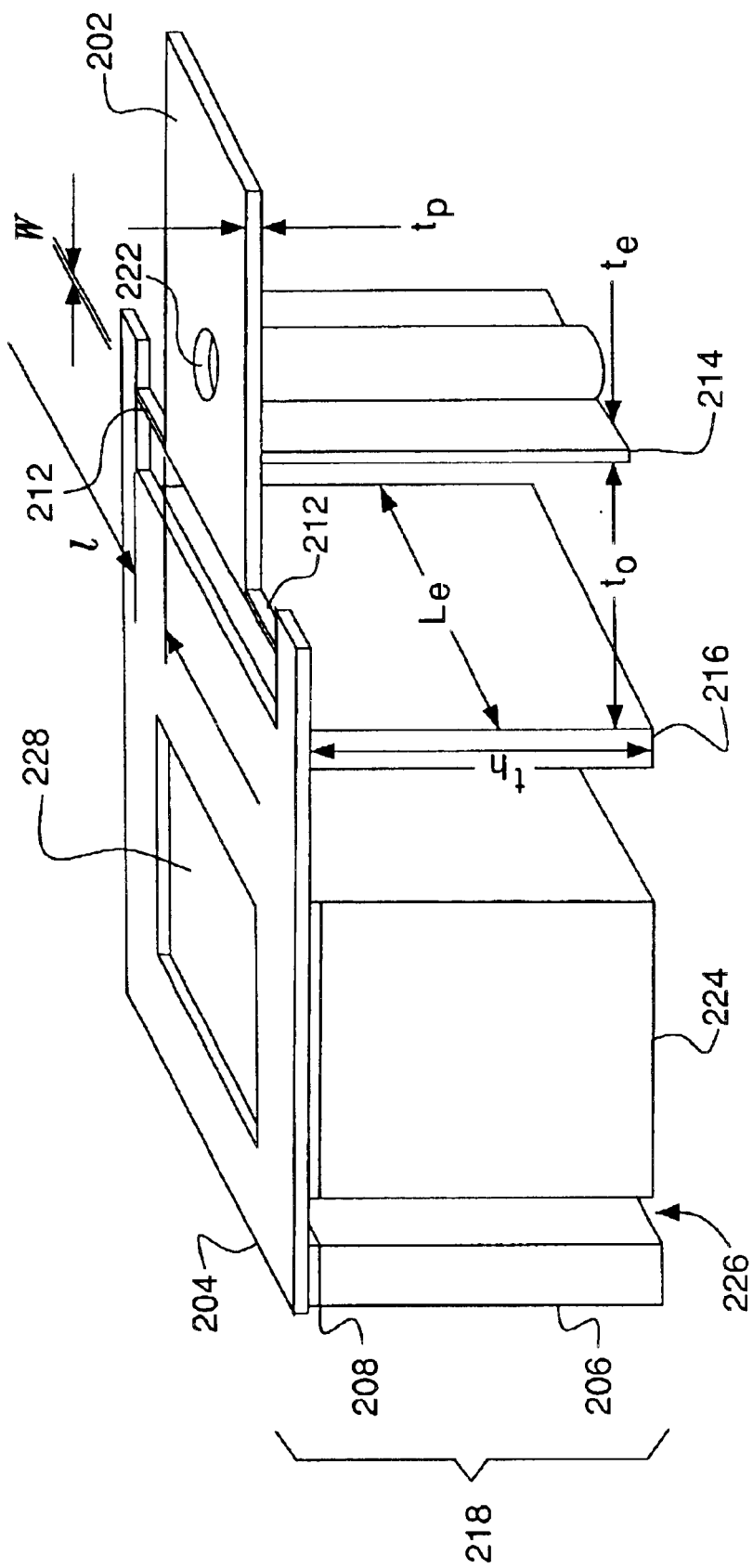
FIG. 2 illustrates a perspective three-dimensional view of an optical switch driven by parallel-plate actuation according to one embodiment of the invention.

FIG. 2 shows a perspective three-dimensional view of a switch 200 according to one embodiment of the invention that may be employed in an optical cross-connect element. Similar to device 100 of FIG. 1, switch 200 has a movable mirror 202 formed in an overlayer 204 of a wafer 218. Wafer 218 has (at least) two additional layers: a substrate layer 206 (also referred to as a handle) and a thin insulating layer 208, which electrically isolates overlayer 204 from handle 206. In one embodiment, wafer 218 is a silicon-on-insulator (SOI) wafer, where overlayer 204 and handle 206 are silicon, and insulating layer 208 is silicon oxide.

In one embodiment, mirror 202 is a cantilevered plate supported by a pair of torsional members 212 connected to overlayer 204 as shown in FIG. 2. Mirror 202 can be rotated about an axis defined by members 212. The result of rotation is a departure of mirror 202 from the plane of overlayer 204. Electrodes 214 and 216 form a parallel-plate actuator in switch 200. Those electrodes are formed in the same wafer (i.e., wafer 218) as mirror 202. In device 100 of FIG. 1, mirror 102 is actuated by electrodes 116 formed in a different wafer (i.e., wafer 114) from that of mirror 102. In contrast to prior art device 100, switch 200 may be a monolithic device, i.e., a device fabricated using a single wafer, for example, an SOI wafer. The monolithic design of switch 200 may alleviate the alignment problem associated with the fabrication of device 100.

Electrodes 214 and 216 of switch 200 are defined in handle 206 of wafer 218. Electrode 214 is rigidly connected to mirror 202 and is movable with that mirror. Electrode 214 is electrically connected to mirror 202 using a via structure 222 protruding through layer 208. In one embodiment, the walls of structure 222 are metal-plated to shunt the insulation of layer 208 between mirror 202 and electrode 214. In a different embodiment, structure 222 may be filled with an electrically conducting material to provide electrical contact between mirror 202 and electrode 214. Mirror 202, in turn, is electrically connected to the rest of overlayer 204 via members 212. Thus, electrode 214 is held at the same potential (e.g., ground) as the rest of overlayer 204.

Electrode 216 is electrically connected to contact block 224 via a bridge (not visible in FIG. 2). Electrode 216 and block 224 are electrically isolated from the rest of handle 206 by a surrounding groove 226. Block 224 has a contact pad 228 that is exposed through an opening formed above a portion of block 224 in layers 204 and 208. Contact pad 228 may be metal-plated as known in the art for better ohmic contact with a wire lead (not shown). Since electrodes 214 and 216 are electrically isolated from each other, a voltage differential can be applied between those electrodes. In one configuration, layers 204 and 206 may be connected to a negative terminal of a voltage source (e.g., ground), whereas pad 228 may be connected to a positive terminal of that voltage source to apply voltage between electrodes 214 and 216.

Switch 200 may be operated as follows. When no voltage is applied between electrodes 214 and 216, mirror 202 is held parallel to the plane of overlayer 204 by torsional members 212. When voltage is applied between electrodes 214 and 216, e.g., as explained above, it exerts an attractive force between the electrodes causing electrode 214 to move toward electrode 216 and deflect mirror 202 downward. The angle of deflection is related to the applied voltage, such that a greater voltage generally produces a greater angle. When the voltage is removed, the restoring torsional force of members 212 will return mirror 202 back into the plane of overlayer 204.

The following description may provide guidance for choosing an operating voltage range and the various dimensions of switch 200 indicated in FIG. 2. For small angles, the critical angle ($\theta_c$) in degrees, defined as a maximum stable angle of deflection of mirror 202 beyond which it becomes unstable due to snap-down may be approximated by Equation (1) as follows:

$$\theta_c = 25.2 \frac{t_0}{t_h} \quad (1)$$

where $t_0$ is the gap between electrodes 214 and 216 and $t_h$ is the thickness of handle 206. The critical voltage ($V_c$) corresponding to the critical angle is given by Equation (2) as follows:

$$V_c^2 = 1.44 \times 10^5 \frac{K}{K_s} \frac{t_p^4 \theta_c^3}{L_e l} \quad (2)$$

where $t_p$ is the thickness of overlayer 204; $L_e$ is the width of electrode 216; l and w are the length and width of torsional member 212, respectively; K is a geometric factor for the torsional spring constant of a rod with a rectangular cross-section of $t_p \times w$ (also see FIG. 2); and $K_s$ is a geometric factor for the torsional spring constant of a similar rod with a square cross-section of $t_p \times t_p$. All dimensions are in microns; the angle is in degrees; and the voltage is in volts.

In one embodiment, one may implement a critical angle of 9° using $t_h$=285 μm and $t_0$=102 μm. Then, a working angle range of 0 to 6° (having a safety cushion of 3° from the critical angle) for switch 200 may be implemented using the following representative parameters: $L_e$=80 μm; $t_p$=1 μm; w=0.5 μm (which corresponds to $K/K_s$=0.203); l=12 μm; and a working voltage range of 0 to approximately 80 volts. These parameters result in a critical voltage of approximately 150 volts. In different embodiments, different parameter values/ranges may be implemented.

FIGS. 3A–C illustrate a possible layout of various components of switch 200. More specifically, FIGS. 3A–B show top and bottom views, respectively, of switch 200. FIG. 3C shows a cross-sectional view of switch 200 along the plane designated AA in FIG. 3A. Referring now to FIG. 3A, contact pad 228 and via structure 222 are visible from the top of switch 200. Also in FIG. 3A, a dashed line indicates the topology of groove 226 in handle 206. Referring now to FIG. 3B, groove 226 defines in handle 206: (i) block 224, (ii) electrode 216, and (iii) a bridge 302 electrically connecting block 224 with electrode 216. Also visible in FIG. 3B is a cross-section of electrode 214 according to one implementation. In particular, electrode 214 has a flat surface that faces electrode 216. The opposite surface of electrode 214 has a bulging center section designed to provide support for via structure 222 as further illustrated in FIGS. 3A and 3C. Referring now to FIG. 3C, the electrical isolation of block 224, bridge 302, and electrode 216 from the rest of the switch structure by means of layer 208 and groove 226 is visible in the cross-sectional view. Also, access to contact pad 228 from the top of switch 200 is illustrated.

Figure 4B:
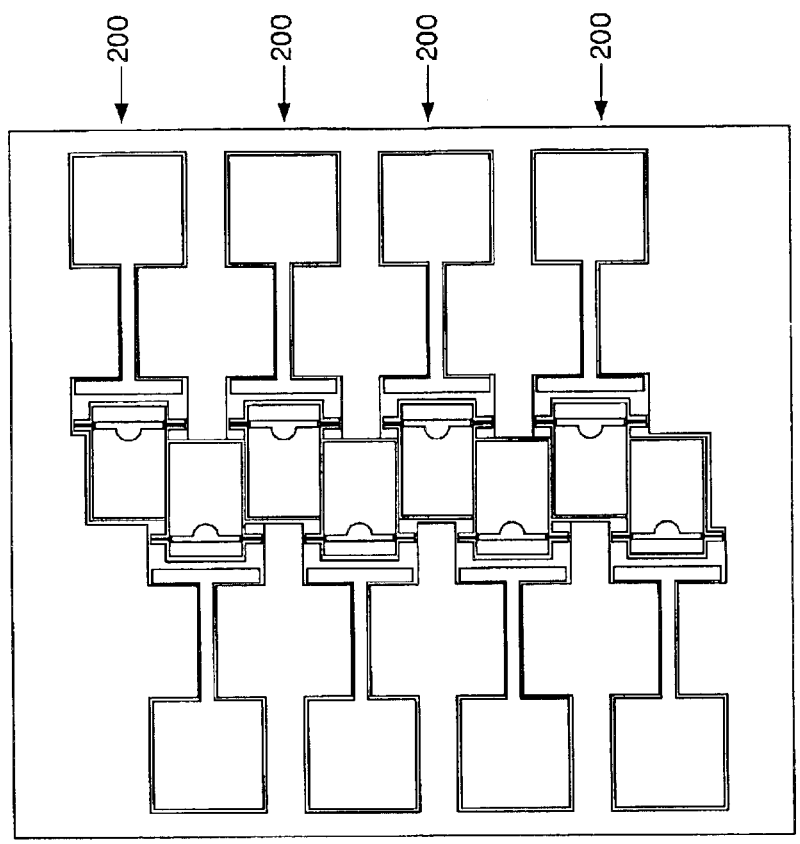
FIGS. 4A–B show top and bottom views, respectively, of an arrayed switch according to one embodiment of the invention.
Figure 4A:
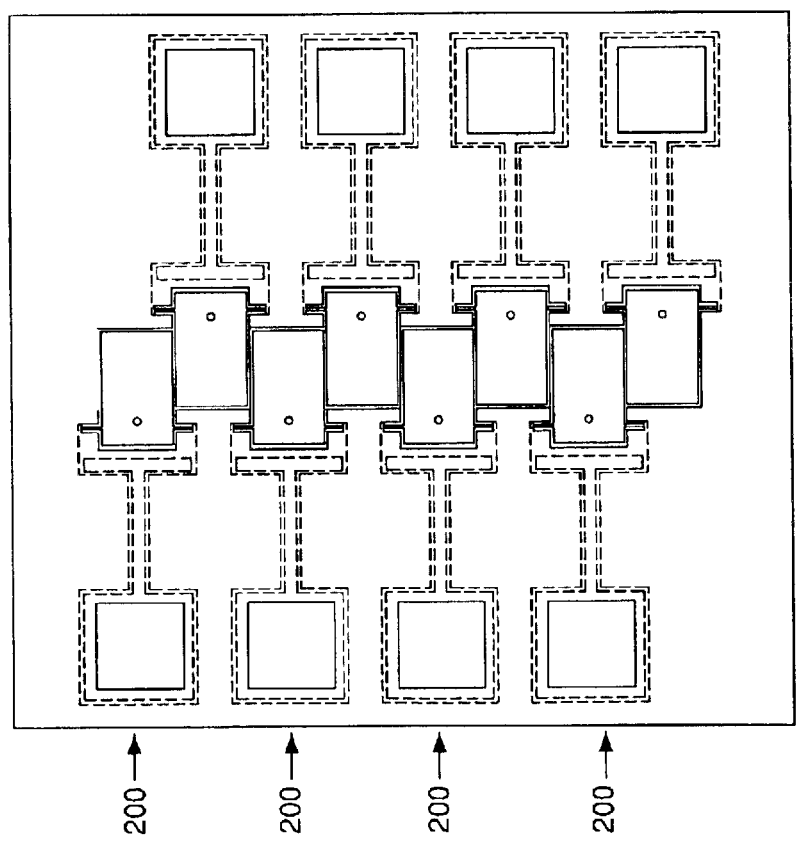

FIGS. 4A–B show the top and bottom views, respectively, of an arrayed switch 400 according to one embodiment of the invention. Switch 400 has eight switches 200. Switches 200 of switch 400 are formed using a single wafer and are staggered such that four contact pads are located on each side (left and right in each of FIGS. 4A–B) of switch 400. Each switch 200 of arrayed switch 400 may be individually actuated using a separate driving voltage applied to a corresponding contact pad. In different embodiments, a different number of switches 200 may be similarly arrayed.

Figure 5A:
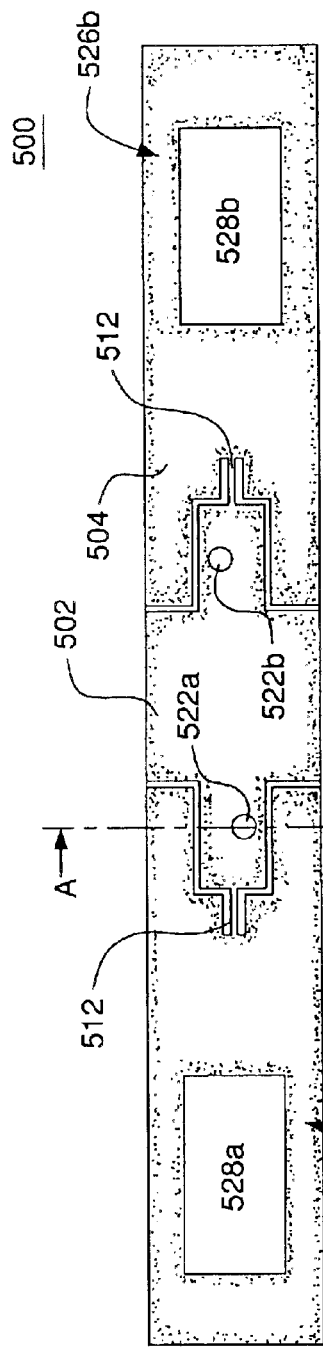
FIGS. 5A–C illustrate top, bottom, and cross-sectional views, respectively, of a switch driven by parallel-plate actuation according to another embodiment of the invention.
Figure 5B:
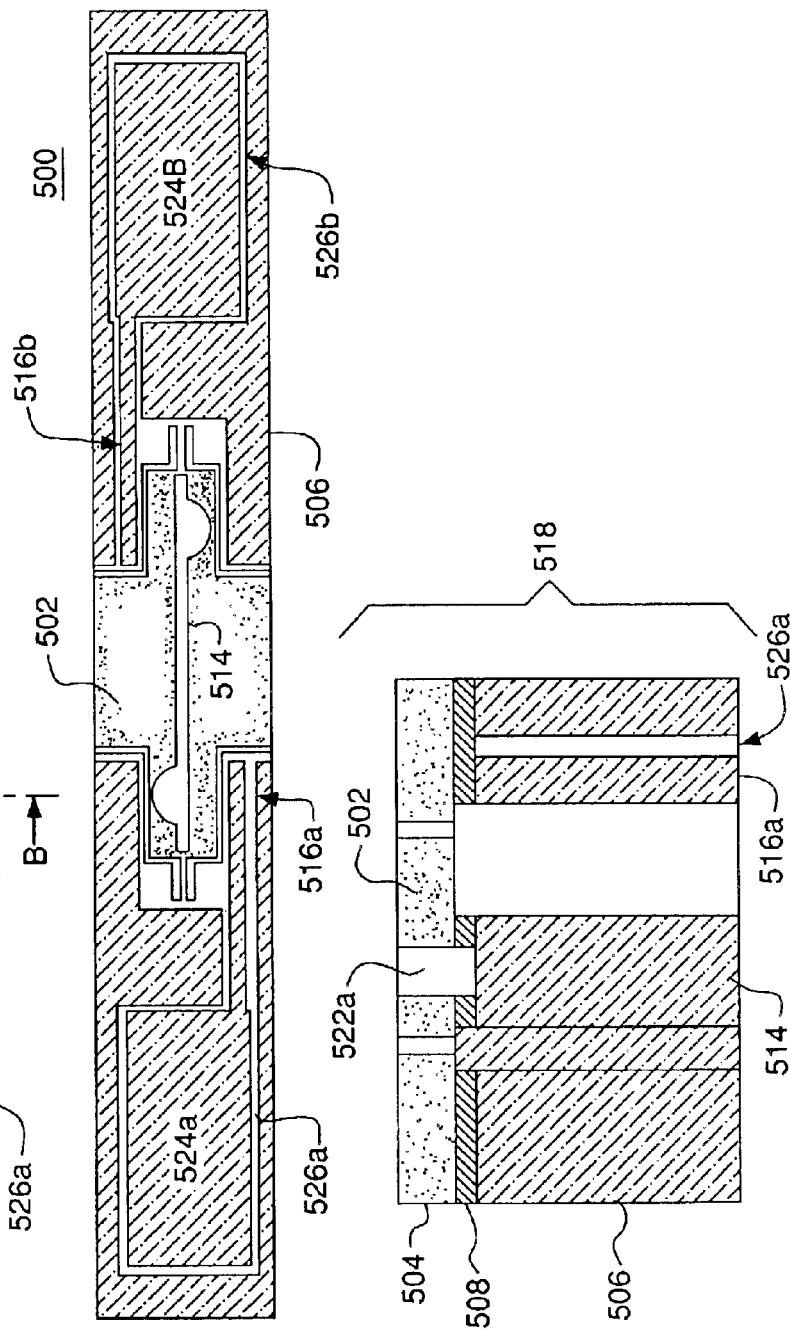
Figure 5C:

FIGS. 5A–C illustrate switch 500 according to another embodiment of the invention. More specifically, FIGS. 5A–B show top and bottom views, respectively, of switch 500. FIG. 5C shows an enlarged cross-sectional view of switch 500 along the plane designated AB in FIG. 5A. Similar to switch 200 of FIGS. 2–3, switch 500 has a movable mirror 502 formed in overlayer 504 of wafer 518. In one embodiment, mirror 502 is a torsional balanced plate supported by a pair of torsional members 512 connected to overlayer 504 as shown in FIGS. 5A–B. Mirror 502 can be rotated about an axis defined by members 512. Rotation of mirror 502 is actuated by electrodes 514 and 516a–b visible, e.g., in FIG. 5B. Electrodes 514 and 516a–b of switch 500 are formed from handle 506 of wafer 518 and are similar to electrodes 214 and 216, respectively, of switch 200. However, in contrast to switch 200 which has one "hot" electrode (i.e., electrode 216 to which "high" potential is applied), switch 500 has two "hot" electrodes 516a–b. As a result, mirror 502 can be rotated in two different directions (e.g., clockwise and counterclockwise in FIG. 5C) from its initial position within the plane of overlayer 504.

Electrode 514 is electrically connected to mirror 502 using two via structures 522a–b that are similar to via structure 222 of switch 200. Each electrode 516a–b is electrically connected to a corresponding contact block 524a–b and is electrically isolated from the rest of handle 506 by a corresponding surrounding groove 526a–b. Each block 524a–b has a contact pad 528a–b that is exposed through an opening formed above a portion of each block 524a–b in layers 504 and 508. Each electrode 516a–b may be independently biased similar to electrode 216 of switch 200.

In one configuration, switch 500 may be operated as follows. When no voltage is applied between electrodes 514 and 516a–b, mirror 502 is held parallel to the plane of overlayer 504 by torsional members 512. When a first "hot" electrode, e.g., electrode 516a, is biased, an attractive force between electrodes 514 and 516a causes mirror 502 to rotate in the corresponding direction, e.g., counterclockwise for the view shown in FIG. 5C. Similarly, to produce a clockwise mirror rotation, electrode 516a is left unbiased (e.g., grounded) whereas an appropriate potential is applied to electrode 516b. In an alternative configuration, electrodes 514 and 516a may be held at constant potentials, e.g., ground and 75 volts, respectively. When electrode 514b is unbiased, mirror 502 is tilted in the counterclockwise direction at a particular angle. Then, biasing electrode 516b, e.g., from 0 to 150 volts, will rotate mirror 502 from that particular angle to being tilted at the same angle in the opposite (i.e., clockwise) direction. Applying the potential of 75 volts at electrode 516b will bring mirror 502 to be parallel to the plane of overlayer 504.

Figure 6B:
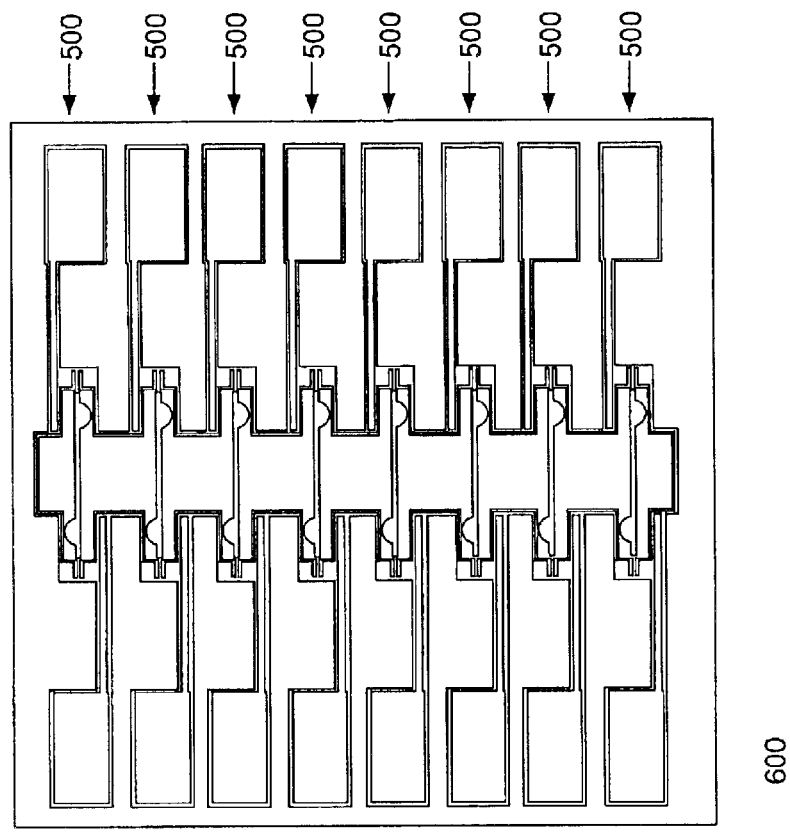
FIGS. 6A–B show top and bottom views, respectively, of an arrayed switch according to yet another embodiment of the invention.
Figure 6A:
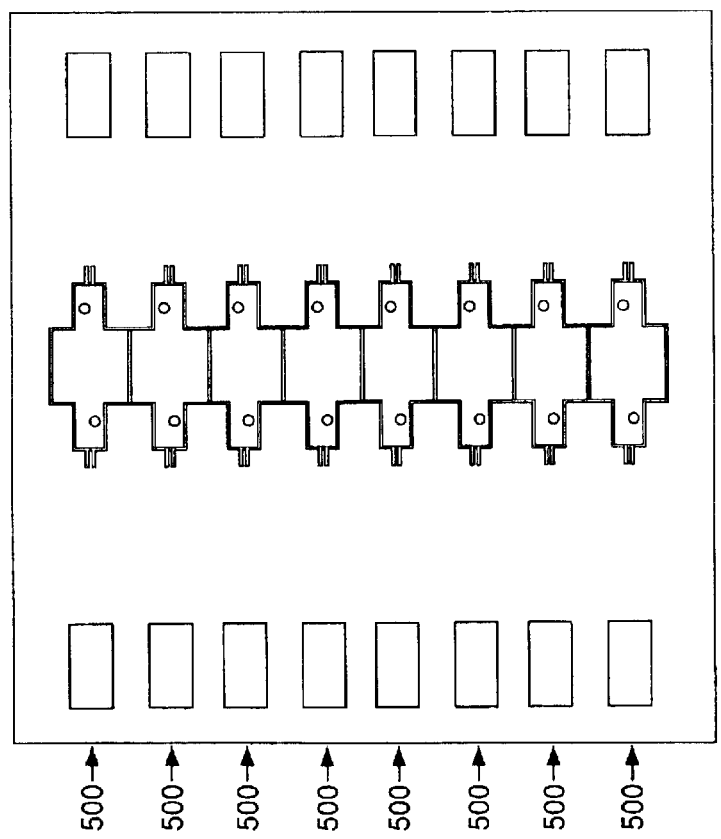

FIGS. 6A–B show the top and bottom views, respectively, of an arrayed switch 600 according to yet another embodiment of the invention. Switch 600 has eight linearly arrayed switches 500 that are implemented using a single wafer. In different embodiments, a different number of switches 500 may be similarly arrayed.

Fringe-Field Actuation

FIG. 7 illustrates a cross-sectional view of a monolithic optical switch 700 according to one embodiment of the invention. Switch 700 of FIG. 7 is similar to switch 200 of FIGS. 2–3. In particular, switch 700 may be fabricated using a single wafer 718 and has mirror 702 and electrode 716. However, in contrast with switch 200, switch 700 does not have electrode 214 (see FIG. 2). Instead, switch 700 has an electrode 714 rigidly connected to a top surface of mirror 702 and movable with that mirror. In one embodiment, electrode 714 may be formed using an additional layer of material, e.g., epi-silicon, deposited over layer 704 of wafer 718.

Electrodes 714 and 716 and mirror 702 form a fringe-field (FF) actuator in switch 700. In one configuration, rotation of mirror 702 in switch 700 is actuated as follows. Electrode 714 is connected to a negative terminal of a voltage source (e.g., ground), e.g., via mirror 702, torsional members 712, and layer 704, whereas electrode 716 is connected to a positive terminal of that voltage source. When no voltage is applied between electrodes 714 and 716, mirror 202 is held parallel to the plane of overlayer 704 by torsional members 712. When voltage is applied between electrodes 714 and 716, the resulting electric field exerts an attractive force between the electrodes causing mirror 702 to deflect upward. The configuration of that electric field is similar to that of the fringe electric field present, e.g., at the periphery of a parallel-plate capacitor. One advantage of using FF actuation is that mirror 702 and electrode 714 of switch 700 can now be designed such that they cannot come into physical contact with electrode 716 during mirror rotation. As a result, switch 700 does not have the snap-down problem associated with prior art device 100 of FIG. 1.

FIG. 8 illustrates a cross-sectional view of an optical switch 800 driven by FF actuation according to another embodiment of the invention. Similar to switch 700 of FIG. 7, switch 800 may be monolithic, i.e., fabricated using a single wafer 818. In one embodiment, wafer 818 has (at least) three layers 804, 806, and 808 that are similar to layers 704, 706, and 708, respectively, of wafer 718. A stationary electrode 816, similar to electrode 216 of switch 700, is formed in handle 806. A mirror 802, which is similar to mirror 202 of switch 800, can be rotated (e.g., as shown by the arrow in FIG. 8) about an axis defined by a pair of torsional members 812. One difference between switch 700 and switch 800 is that switch 800 does not have a movable electrode connected to the mirror similar to electrode 714 of switch 700. Instead, mirror 802 forms one half of an FF actuator in switch 800, whereas electrode 816 forms the other half. Similar to switch 700, switch 800 does not have the snap-down problem associated with device 100.

In one implementation of switch 800, the length of mirror 802 is comparable with the thickness of handle 806 and the maximum mirror-end displacement during rotation is small compared to that thickness. For example, the following representative dimensions may be used: (1) 125 $\mu$m for the length of mirror 802; (2) 250 $\mu$m for the thickness of handle 806; and (3) 13 $\mu$m (corresponding to about 6° rotation) for the maximum mirror-end displacement. In other implementations, different dimensions may be used.

FIG. 9 illustrates a cross-sectional view of an optical switch 900 driven by FF actuation according to yet another embodiment of the invention. In one implementation, switch 900 may be fabricated using two SOI wafers, e.g., wafers 918a and 918b, as follows. A mirror 902 and torsional members 912 are formed in an overlayer 904a of wafer 918a and a corresponding opening 910a is formed in layers 906a and 908a of that wafer. An electrode 916 is defined in an overlayer 904b of wafer 918b and an opening 910b is formed in overlayer 904b and an underlying layer 908b of that wafer. Then, wafer 918a is flipped over and attached to wafer 918b using a layer 920 (e.g., glue) of dielectric material such that mirror 902 is positioned above opening 910b. The size of opening 910b is chosen to accommodate mirror displacement indicated by the arrow in FIG. 9 during switch operation. Similar to mirror 802 and electrode 816 of switch 800 of FIG. 8, mirror 902 and electrode 916 form an FF actuator in switch 900.

In preferred implementations of the FF actuators in optical switches 800 and 900, the length of the movable mirror is comparable to the height of the stationary FF electrode. Since the thickness of layer 904b and, consequently, the height of electrode 916 can be made significantly smaller than those dimensions of handle 806 and electrode 816, respectively, a smaller mirror can be implemented in switch 900 compared to that in switch 800. In addition, switch 900 does not have relatively narrow and deep trenches in handle 906a, e.g., those similar to groove 826 in switch 800. As a result, certain fabrication steps for switch 900 may be simplified.

FIG. 10 illustrates a cross-sectional view of an optical switch 1000 driven by FF actuation according to a different embodiment of the invention. The geometric configuration of an FF actuator in switch 1000, having a mirror 1002 and an electrode 1016, is similar to that in switch 900 (see FIG. 9). However, in contrast with the two-piece design of switch 900, switch 1000 can be made monolithic. In one implementation, switch 1000 may be fabricated using an SOI wafer 1018 as follows. Mirror 1002 and torsional members 1012 are formed in an overlayer 1004 of wafer 1018 and a corresponding opening 1010a is formed in layers 1006 and 1008 of that wafer. Then, two additional layers, layer 1020 and layer 1022, are deposited over layer 1004 of wafer 1018 such that an opening 1010b is formed above mirror 1002. Layer 1020 may be silicon oxide and layer 1022 may be epi-silicon. Electrode 1016 is defined in layer 1022 using a trench 1026. Switch 1000 provides optical access to both sides of mirror 1002, where one optically accessible side of mirror 1002 is located in opening 1010b, which can be shallower than opening 910a in switch 900. Shallow opening 1010b may enable easier optical coupling of input/output fibers to switch 1000.

Figure 11F:
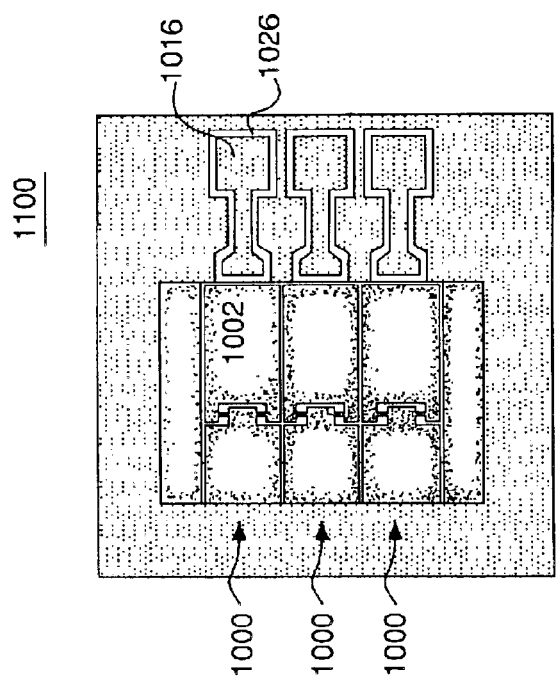
Figure 11E:
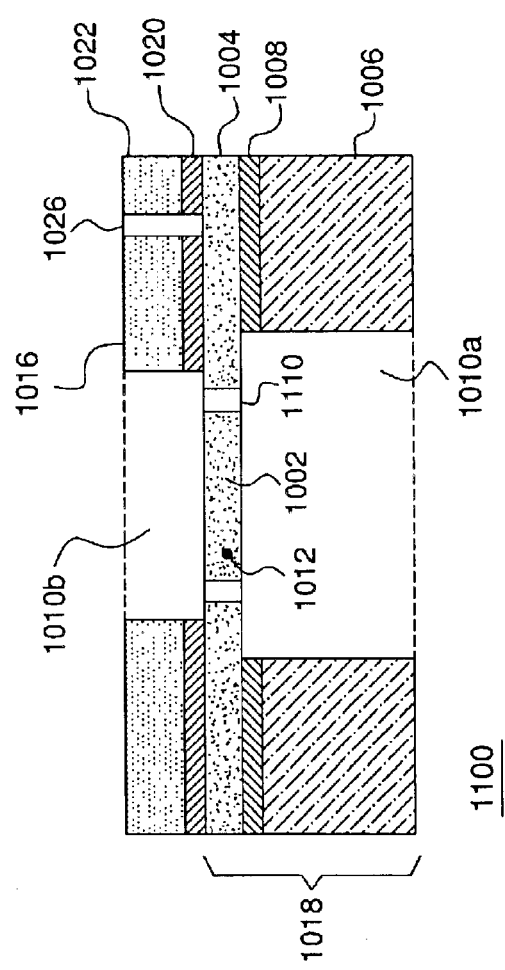

FIGS. 11A–F illustrate representative fabrication steps of an arrayed optical switch 1100 according to one embodiment of the invention. More specifically, FIGS. 11A, 11C, and 11E show cross-sectional views of arrayed switch 1100 during those fabrication steps, whereas FIGS. 11B, 11D, and 11F show the corresponding top views. In one embodiment, arrayed switch 1100 has three switches 1000 of FIG. 10. In other embodiments, a different number of switches 1000 may be similarly arrayed.

Referring to FIGS. 11A–B, mirror 1002 and a pair of torsional members 1012 are defined in overlayer 1004 of wafer 1018 for each switch 1000 using grooves 1110. In one implementation, torsional members 1012 may be shaped as straight rods. Grooves 1110 may be formed using reactive etching. Referring to FIGS. 11C–D, first, thin silicon oxide layer 1020 is deposited onto overlayer 1004 of wafer 1018. Then, poly-silicon layer 1022 is deposited over layer 1020. After that, layer 1022 is patterned and etched to form electrode 1016 and opening 1010b for each switch 1000. Each electrode 1016 is electrically isolated from the rest of layer 1022 using the corresponding trench 1026 formed in that layer. Referring to FIGS. 11E–F, opening 1010a is formed in handle 1006 of wafer 1018 using, e.g., deep reactive ion etching (DRIE). DRIE stops automatically at a silicon oxide layer, e.g., layer 1008 of wafer 1018. Then, portions of layer 1008 and layer 1020 corresponding to openings 1010a and 1010b, respectively, as well as the silicon oxide in grooves 1110, are removed to release mirror 1002 in each switch 1000. Optionally, portions of layer 1020 corresponding to each trench 1026 may also be removed.

Figure 12:
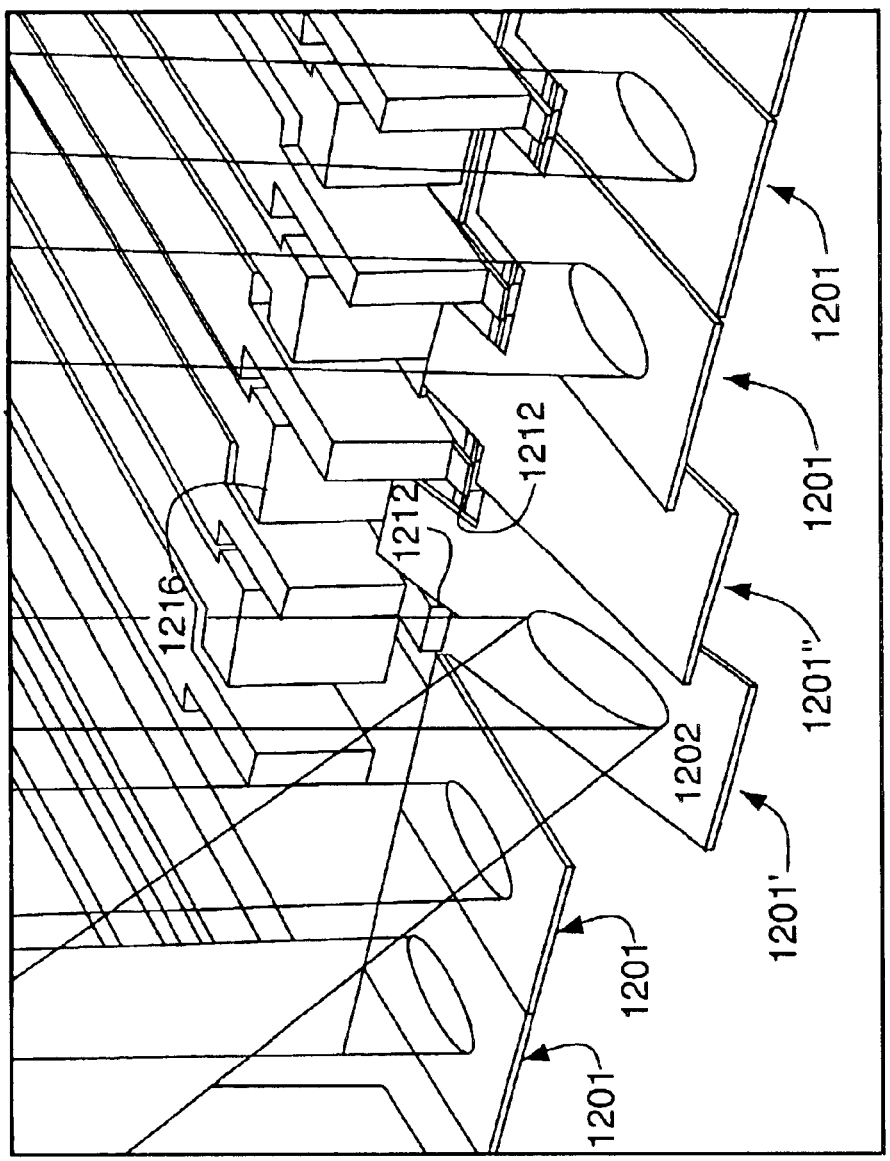
FIG. 12 illustrates a perspective three-dimensional view of an arrayed optical switch according to another embodiment of the invention.

FIG. 12 shows a perspective three-dimensional view of an arrayed switch 1200 according to another embodiment of the invention. Switch 1200 has a plurality of optical switches 1201, each of which is similar to switch 1000 illustrated in FIGS. 10–11. Each switch 1201 has an FF actuator, having a mirror 1202 and an electrode 1216, similar to that in switch 1000. In FIG. 12, the mirrors of switches labeled 1201' and 1201" are shown in tilted positions, e.g., resulting from voltages applied to the corresponding FF actuators.

One difference between each switch 1201 of FIG. 12 and switch 1000 of FIG. 10 is that electrode 1216 in switch 1201 is located in relative proximity to the axis of rotation defined by torsional members 1212, whereas electrode 1016 in switch 1000 is located relatively far from the corresponding axis. Such locations of electrode 1212 in switch 1201 and electrode 1016 in switch 1000 are referred to as being at the short and long end of the mirror, respectively. Placing the electrode at the short end enables the same switch design to be adapted for different applications that may require different mirror sizes. In particular, as can be seen in FIG. 12, the length of the long end of mirror 1202 can be designed to be longer while leaving the rest of the switch layout essentially the same as in switch 1000.

Figure 13B:
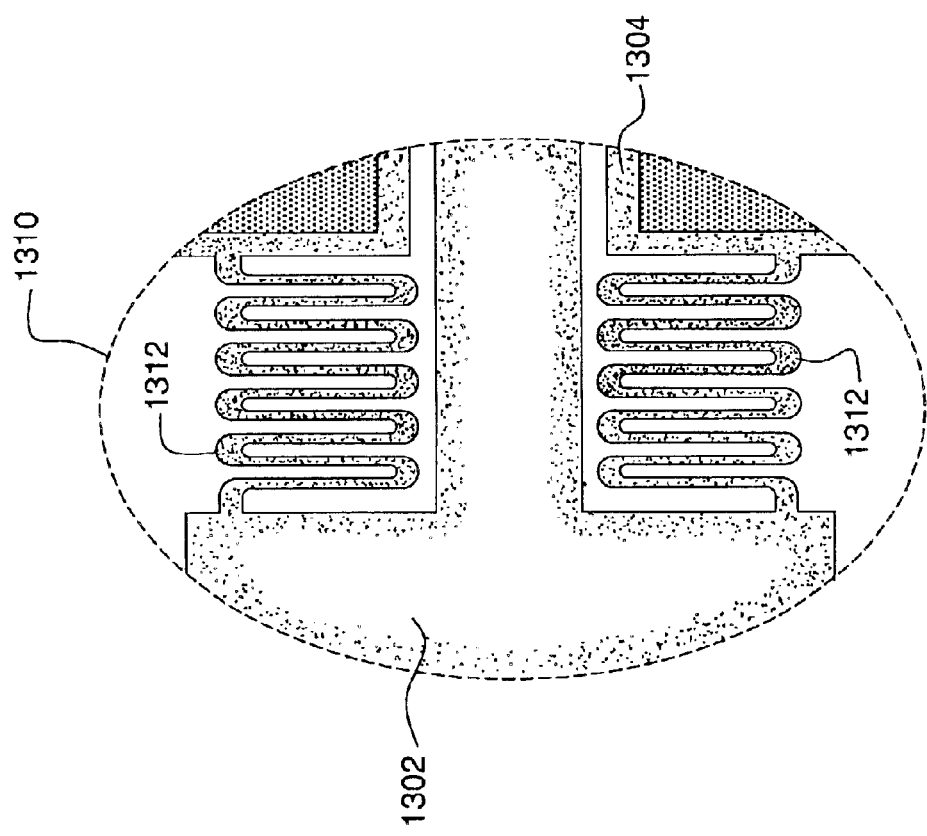
FIGS. 13A–B illustrate an arrayed optical switch according to yet another embodiment of the invention.
Figure 13A:
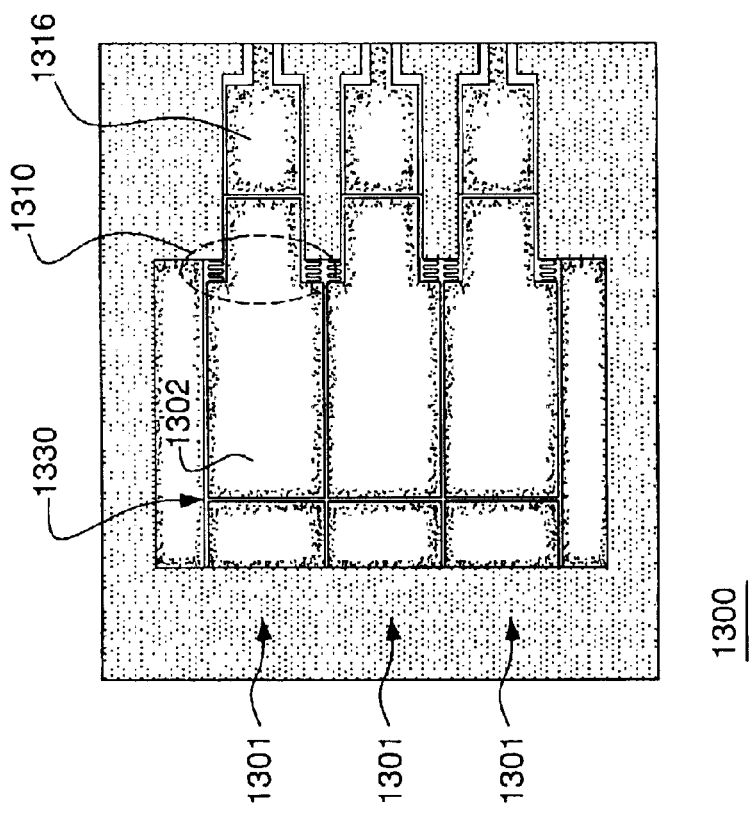

FIGS. 13A–B show top views of an arrayed optical switch 1300 according to yet another embodiment of the invention. Arrayed switch 1300 has three optical switches 1301, each of which is similar to switch 1201 illustrated in FIG. 12. In particular, each switch 1301 has an electrode 1316 located at the short end of a mirror 1302. Consequently, etching a line 1330 in each switch 1301 at a different distance from electrode 1316 will vary the length of mirror 1302 from switch to switch while leaving the rest of the switch layout essentially unchanged.

One difference between switch 1301 and switch 1201 is in the support structure of mirror 1302 outlined in FIG. 13A and enlarged in FIG. 13B. Support structure 1310 of switch 1301 has two serpentine springs 1312, each spring 1312 connected between mirror 1302 and the rest of overlayer 1304. A serpentine spring is typically less stiff than a corresponding straight rod if both are configured to fit within a comparable gap between the mirror and the rest of the overlayer. As a result, compared to mirror 1202 of switch 1201, mirror 1302 may be tilted at a particular angle applying a lower voltage to electrode 1316 than to electrode 1216.

Figure 14:
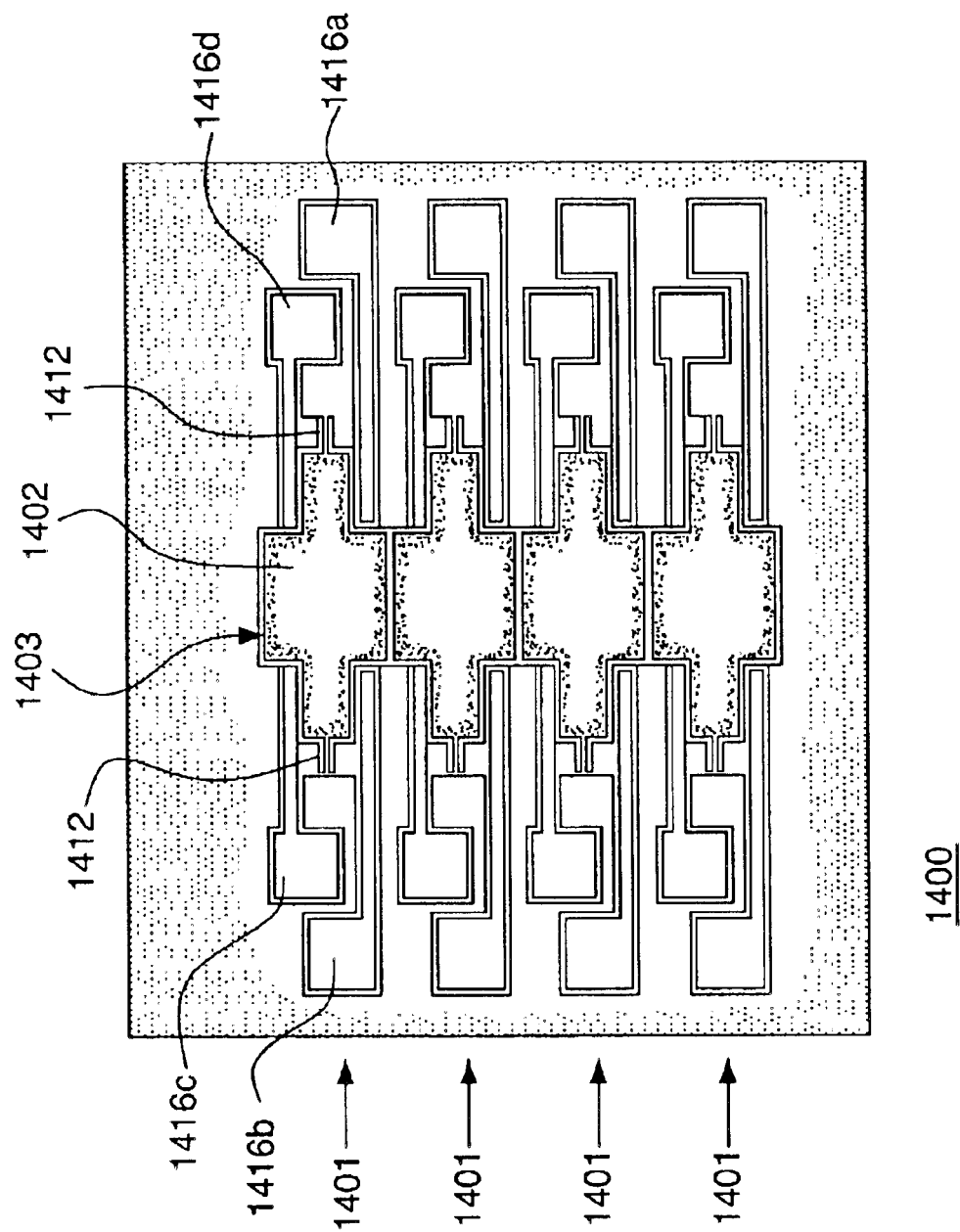
FIG. 14 illustrates an arrayed optical switch according to one additional embodiment of the invention.

FIG. 14 illustrates an arrayed optical switch 1400 according to one additional embodiment of the invention. Switch 1400 has four optical switches 1401. Each switch 1401 has a movable mirror 1402 implemented as a torsional plate and supported by torsional members 1412. Each switch 1401 further has an FF actuator including two pairs of electrodes 1416a–d. Each electrode 1416a–d is implemented, e.g., similar to electrode 1016 of switch 1000. A first pair of electrodes 1416a–b and a second pair of electrodes 1416c–d are located on different sides of the axis defined by members 1412 to enable mirror rotation in two different directions. For example, when the first pair of electrodes 1416a–b is biased, mirror 1402 is tilted such that an edge 1403 of that mirror rotates down from the plane of FIG. 14. Similarly, when the second pair of electrodes 1416c–d is biased, edge 1403 rotates up from the plane of FIG. 14. In one configuration, each electrode 1416a–d may be supplied an independent voltage. In that case, the resulting (angle and direction of) mirror rotation is determined by the composite torque corresponding to the particular combination of individual voltages. Bidirectional mirror rotation in switch 1401 may help to implement a relatively wide steering range for mirror 1402.

Figure 15:
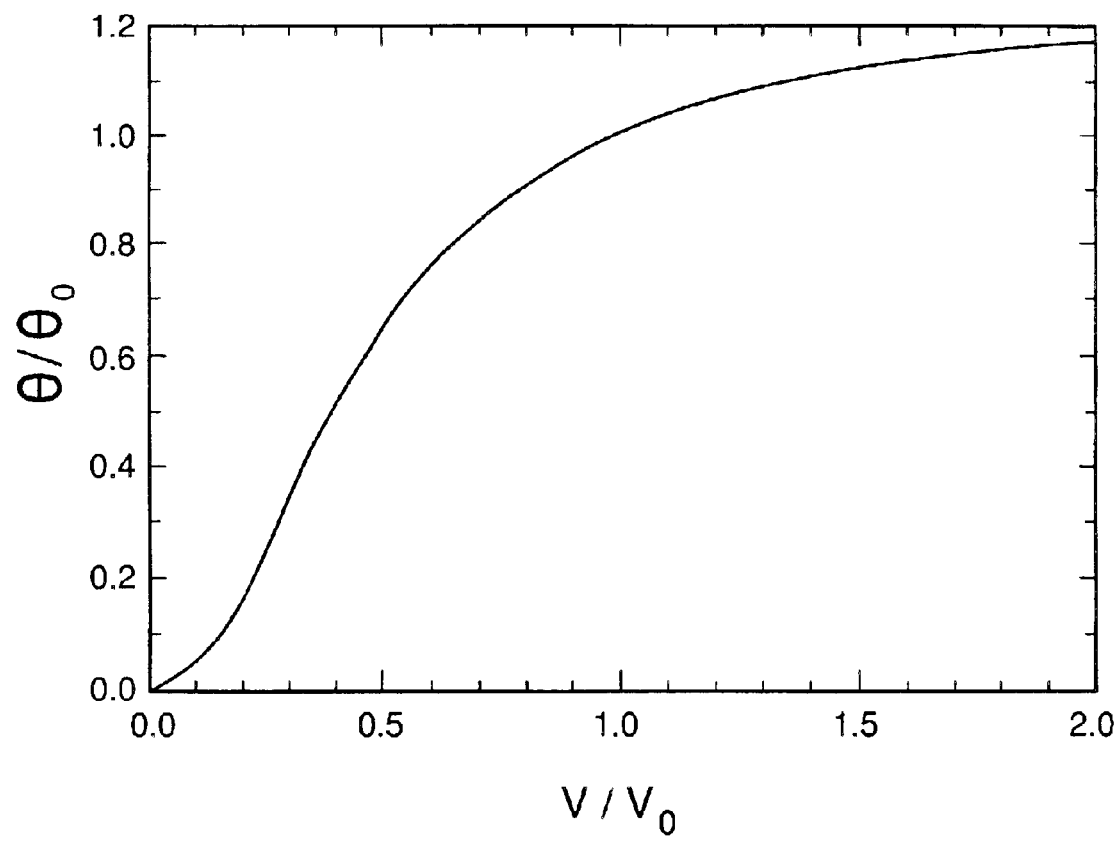
FIG. 15 shows a representative angle-voltage response curve for a fringe-field actuated optical switch of the invention.

FIG. 15 shows a representative angle-voltage response curve for an optical switch of the invention configured with an FF actuator. The voltage (V) is measured in relative units of $V/V_0$, where $V_0$ is a characteristic voltage value related to the geometry (i.e., the dimensions of and distances between various parts) of the switch. Similarly, the angle of rotation ($\theta$) is measured in relative units of $\theta/\theta_0$, where $\theta_0$ is a characteristic angle also related to the geometry of the switch. For example, in one representative switch implementation, $\theta_0$ and $V_0$ may be 8° and 150 volts, respectively. As can be seen in FIG. 15, FF actuation results in an S-shaped response curve. In particular, after an inflection at about $V/V_0=0.4$, the angle of rotation asymptotically approaches a maximum value of $\theta/\theta_0 \approx 1.2$ as the voltage increases. Due to this feature, switches of the invention are less susceptible to damage associated with sudden voltage spikes that may accidentally be applied to the actuator. In contrast, such spikes are very likely to cause snap-down and damage in prior art device 100.

Two-Axis Fringe-Field Actuation

FIGS. 16A–C illustrate top and cross-sectional views of a two-axis switch 1600 driven by fringe-field actuation according to one embodiment of the invention. More specifically, FIG. 16A illustrates the layout of one layer in switch 1600; FIG. 16B is a top view of switch 1600; and FIG. 16C is a cross-sectional view of switch 1600 along the plane designated CD in FIG. 16A.

Switch 1600 has a movable mirror 1602 that is similar to mirror 1302 of switch 1301 (FIG. 13). However, a different support structure 1610 is used for mirror 1602 in switch 1600 than that for mirror 1302 in switch 1301. Structure 1610 has a movable plate 1630 and four serpentine springs 1612a–d. Springs 1612a–b are connected between mirror 1602 and plate 1630 and springs 1612c–d are configured to support plate 1630 on a substrate. In one embodiment, mirror 1602 and structure 1610 may be implemented using a wafer 1618 that includes the substrate and is similar to, e.g., wafer 1018 of FIG. 10. More specifically, layers 1604, 1606 (the substrate), and 1608 of wafer 1618 are analogous to layers 1004, 1006, and 1008, respectively, of wafer 1018. Mirror 1602 and structure 1610 are formed in layer 1604 such that springs 1612c–d are connected between plate 1630 and the rest of layer 1604.

Referring now to FIGS. 16B–C, switch 1600 has an FF actuator including mirror 1602, plate 1630, and two electrodes 1616a–b. Electrode 1616a is connected to plate 1630 and is movable with that plate, whereas electrode 1616b is connected to layer 1604 and is stationary. Electrodes 1616a–b may be implemented using two additional layers 1620 and 1622 deposited over layer 1604 of wafer 1618. In one embodiment, layers 1620 and 1622 are analogous to layers 1020 and 1022, respectively, of switch 1000 (FIG. 10). Briefly, electrodes 1616a–b are formed in layer 1622 such that layer 1620 provides electrical insulation from underlying layer 1604. As a result, each electrode 1616a–b may be individually biased.

Referring to FIG. 16A (showing the layout of layer 1604), switch 1600 further has conducting tracks 1632a–c configured to connect electrodes 1616a–b to the corresponding contact pads (not shown). Tracks 1632a–b are defined in layer 1604 using trenches etched in that layer and configured to electrically isolate those tracks from the rest of layer 1604. Similarly, track 1632c is defined in plate 1630. In addition, tracks 1632a and 1632c are formed such that spring 1612d is connected between terminal portions of those tracks. Consequently, an electrical path to electrode 1616a includes track 1632a, spring 1612d, and track 1632c. An electrical path to electrode 1616b includes track 1632b. Mirror 1602 is electrically connected to layer 1604 through springs 1612a–b, plate 1630, and spring 1612c.

Referring again to FIGS. 16B–C, switch 1600 further has via structures 1634a and 1634b designed to shunt the insulation of layer 1620 and to provide electrical contact between electrode 1616a and track 1632c and between electrode 1616b and track 1632b, respectively. Each via structure 1634a–b may be similar to, e.g., via structure 222 in switch 200 (see FIG. 2). In one embodiment, switch 1600 may also have a dividing barrier 1636 connected to plate 1630 and movable with that plate. An additional via structure 1634c may be formed to provide electrical contact between barrier 1636 and plate 1630. In certain embodiments, barrier 1636 may also be used to maintain mechanical integrity of the conducting tracks.

Plate 1630 can be rotated about an axis defined by springs 1612c–d, which axis corresponds to line CD in FIG. 16A. Since mirror 1602 is connected to plate 1630, axis CD is a first axis of rotation for mirror 1602. Mirror 1602 can also be rotated about a second axis defined by springs 1612a–b and labeled AB in FIG. 16A. In the embodiment shown in FIG. 16, axes AB and CD are orthogonal. In a different embodiment, the two axes of rotation may be implemented at a different angle.

In one configuration, layer 1604 and therefore plate 1630 and mirror 1602 are connected to the negative terminal of a voltage source (e.g., ground), whereas electrodes 1616a–b are connected to two different positive terminals of that voltage source. In a different configuration, voltages of different polarities in various combinations may be applied to layer 1604 and electrodes 1616a–b. Switch 1600 may be operated as follows. When no voltage is applied to electrodes 1616a–b, plate 1630 and mirror 1602 are held parallel to the plane of layer 1604 by springs 1612a–d. When electrode 1616a is biased, mirror 1602 rotates about axis AB (see FIG. 16A) such that in the view shown in FIG. 16C mirror 1602 tilts down. Similarly, when electrode 1616b is biased, plate 1630 and therefore mirror 1602 rotate about axis CD (see FIG. 16A) such that in the view shown in FIG. 16B an edge 1640 of plate 1630 rotates up from the plane of FIG. 16. By independently varying the voltages applied to electrodes 1616a and 1616b, the angles of rotation of mirror 1602 about axes AB and CD, respectively, can be changed independently. Optional dividing barrier 1636 may be held at the ground potential, providing electrical shielding between electrodes 1616a–b. Such shielding may help to reduce crosstalk between those electrodes and provide better stability and/or reproducibility of operation for switch 1600.

Figure 17:
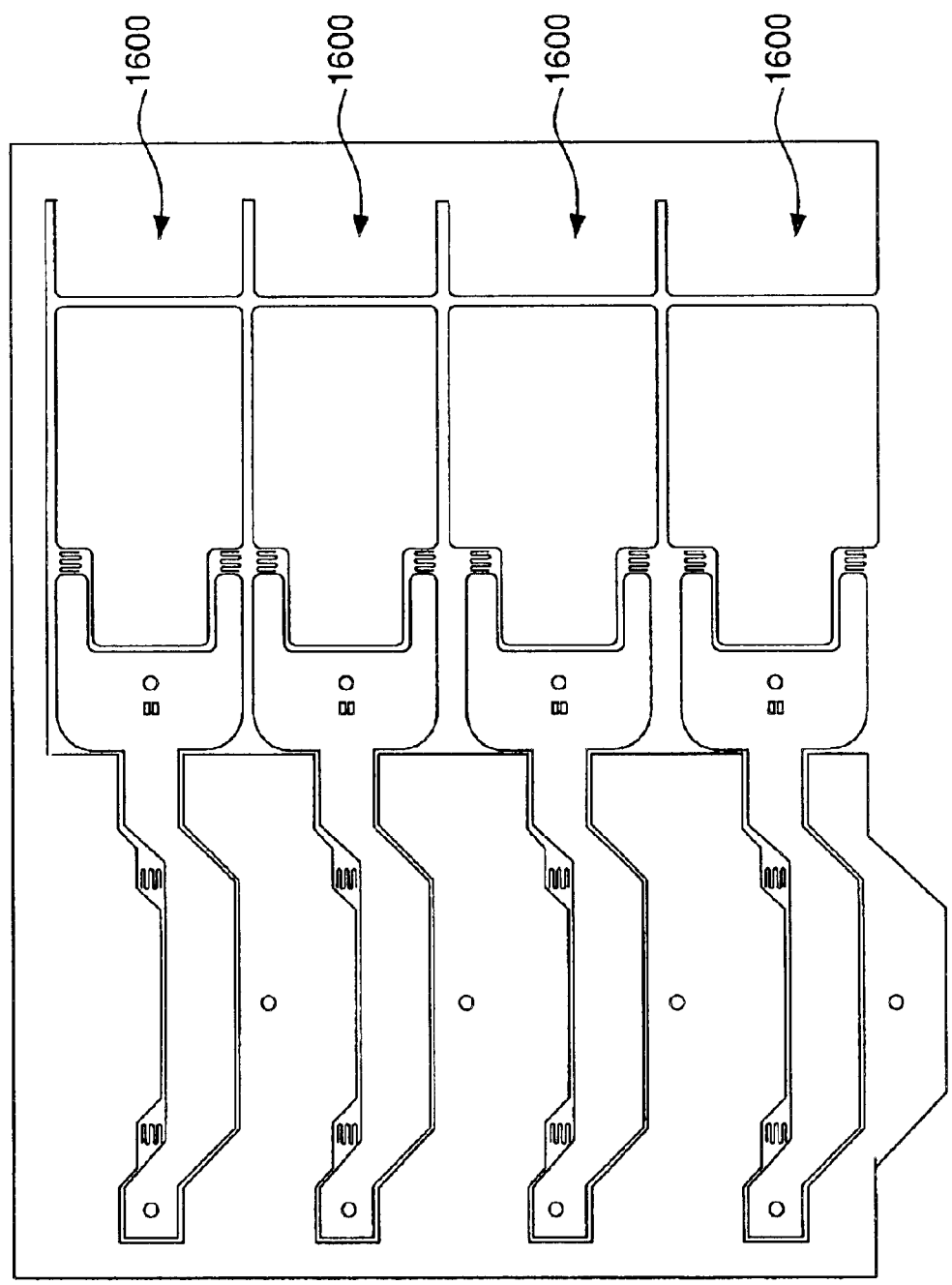
FIG. 17 illustrates an arrayed optical switch having four optical switches of FIG. 16 according to one embodiment of the invention.

FIG. 17 shows a top view of an arrayed optical switch 1700 according to one embodiment of the invention. Switch 1700 has four linearly arrayed and independently operated switches 1600 of FIG. 16. In a different embodiment, a different number of switches 1600 may be similarly arrayed. In a preferred implementation, switch 1700 is monolithic.

FIGS. 18A–B illustrate cross-sectional and top views, respectively, of a two-axis switch 1800 driven by fringe-field actuation according to another embodiment of the invention. Switch 1800 is similar to switch 1600 of FIG. 16 with similar numbers labeling similar structural elements in these two switches. Also, FIGS. 18A–B show the views of switch 1800 corresponding to those of switch 1600 shown in FIGS. 16A–B, respectively. In particular, FIG. 18A illustrates the layout of layer 1804 and FIG. 18B shows a top view of switch 1800.

One difference between switches 1600 and 1800 is that movable plates 1630 and 1830 are differently shaped. More specifically, a left-side portion of plate 1830 is S-shaped, whereas a corresponding portion of plate 1630 is U-shaped. In addition, a fringe-field actuator in switch 1800 has a second stationary electrode 1816c, which is similar to stationary electrode 1816b. Electrode 1816c is connected to a corresponding contact pad (not shown) through a via structure 1834c and conducting track 1832d. Electrodes 1816b and 1816c are located on different sides of axis CD to enable plate rotation about that axis in two different directions. For example, when electrode 1816b is biased, plate 1830 is tilted such that an edge 1840 of that plate rotates up from the plane of FIG. 18. Similarly, when electrode 1816c is biased, edge 1840 rotates down from the plane of FIG. 18. Bidirectional plate rotation in switch 1800 may help to implement a wider steering range for mirror 1802 compared to that for mirror 1602 in switch 1600.

FIGS. 19A–B illustrate cross-sectional and top views, respectively, of a two-axis switch 1900 driven by fringe-field actuation according to yet another embodiment of the invention. FIG. 19A illustrates layout of layer 1904, which is analogous to layer 1804 in switch 1800 of FIG. 18, and FIG. 19B shows a top view of switch 1900. Certain structural elements in switch 1900 are similar to certain structural elements in switch 1800 with similar numbers labeling those similar structural elements in FIGS. 18 and 19. The following description explains certain structural elements in switch 1900 that are different from and/or do not have the corresponding structural elements in switch 1800.

Mirror 1902 in switch 1900 is rigidly connected to a movable plate 1903, which is configured as a torsional plate with respect to movable plate 1930 using springs 1912a–b. Two electrodes 1916a and 1916d are rigidly connected to plate 1930. Electrode 1916d has two split parts 1916d' and 1916d" located on two different sides of a strip 1905 that connects mirror 1902 to plate 1903.

Figure 20:
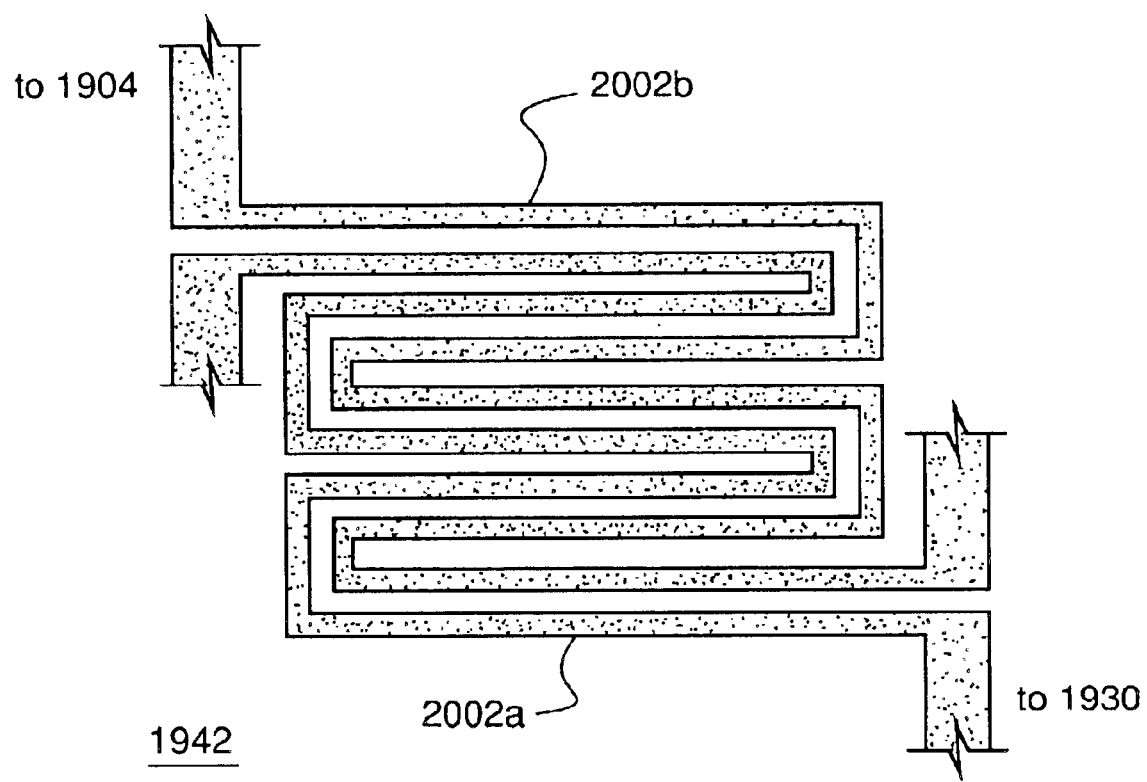
FIG. 20 shows a serpentine spring used in the switch of FIG. 19 according to one embodiment of the invention.

FIG. 20 shows an enlarged view of a serpentine, multipart spring 1942, two of which are used in switch 1900 to connect plate 1930 to the rest of layer 1904 (i.e., springs 1942a–b in FIG. 19A). Each multipart spring 1942a–b has two cooperating (e.g., split) parts 2002a and 2002b that are not in direct electrical contact with each other. As a result, spring 1942 can provide two independent electrical leads using a separate split part for each lead. In alternative embodiments, a multipart spring may have more that two different cooperating parts, each of which can provide a different independent lead.

Referring again to FIGS. 19A–B, the following electrical paths are provided from an external voltage source and contact pads (not shown) to electrodes 1916a–d, plate 1930, and plate 1903 in switch 1900. An electrical path to electrode 1916a includes track 1932a, a first split part of spring 1942a, track 1932c, and via structure 1934a. An electrical path to electrode 1916d" includes track 1932g, a first split part of spring 1942b, track 1932e, and via structure 1934d". Electrode 1916d' is connected to track 1932e through via structure 1934d', track 1932f, and an arch structure 1950. Electrical paths to electrodes 1916b and 1916c include tracks 1932b and 1932d, respectively. Plate 1930 is connected to the rest of layer 1904 through second split parts of springs 1942*a–b*, and plate 1903 is connected to plate 1930 through springs 1912*a–b*.

Electrodes 1916*a* and 1916*d* are located on different sides of axis AB defined by springs 1912*a–b* to enable rotation of plate 1903 about that axis in two different directions. Similarly, electrodes 1916*b* and 1916*c* are located on different sides of axis CD defined by springs 1942*a–b* to enable rotation of plate 1930 about that axis in two different directions. As a result, mirror 1902 can be rotated in two different directions about each axis. For example, when electrode 1916*a* is biased, plate 1903 (and therefore mirror 1902) is tilted such that an edge 1944 of that plate rotates up from the plane of FIG. 19. Similarly, when electrode 1916*d* is biased, edge 1944 rotates down from the plane of FIG. 19. Furthermore, when electrode 1916*b* is biased, plate 1930 (and therefore mirror 1902) is tilted such that an edge 1940 of that plate rotates up from the plane of FIG. 19. Similarly, when electrode 1916*c* is biased, edge 1940 rotates down from the plane of FIG. 19. Bidirectional rotation about both axes in switch 1900 may further increase the steering range for mirror 1902 compared to that for mirror 1802 in switch 1800.

Figure 21:
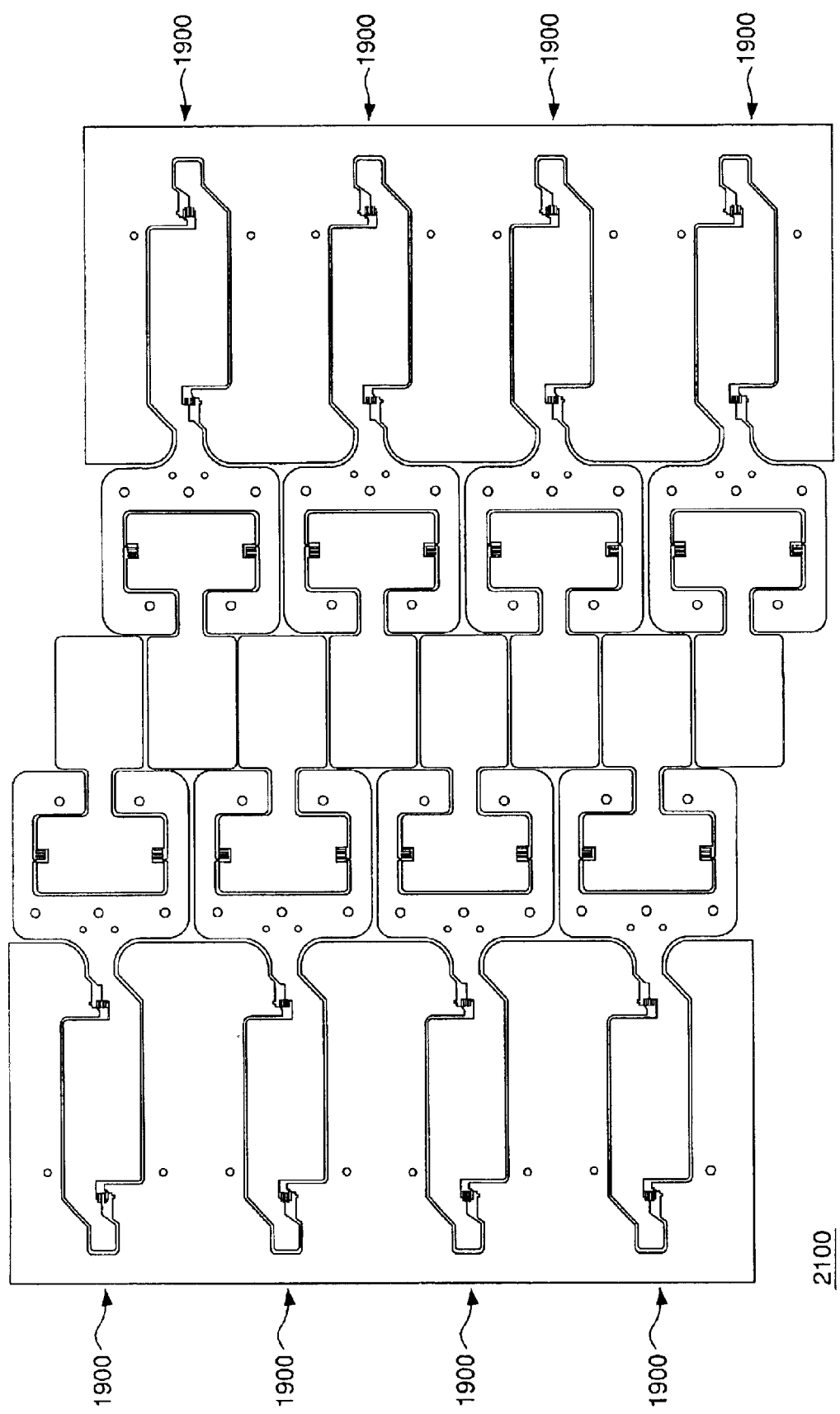
FIG. 21 illustrates an arrayed optical switch having eight optical switches of FIG. 19 according to one embodiment of the invention.

FIG. 21 shows an arrayed switch 2100 according to one embodiment of the invention. Switch 2100 has eight switches 1900 and provides a linear array of mirrors. Switches 1900 are staggered to have their contact pads (not shown) distributed along the perimeter of switch 2100. Each switch 1900 of arrayed switch 2100 may be individually actuated using a separate set of driving voltages applied to the corresponding set of contact pads. In different embodiments, a different number of switches 1900 may be similarly arrayed.

Figure 22:
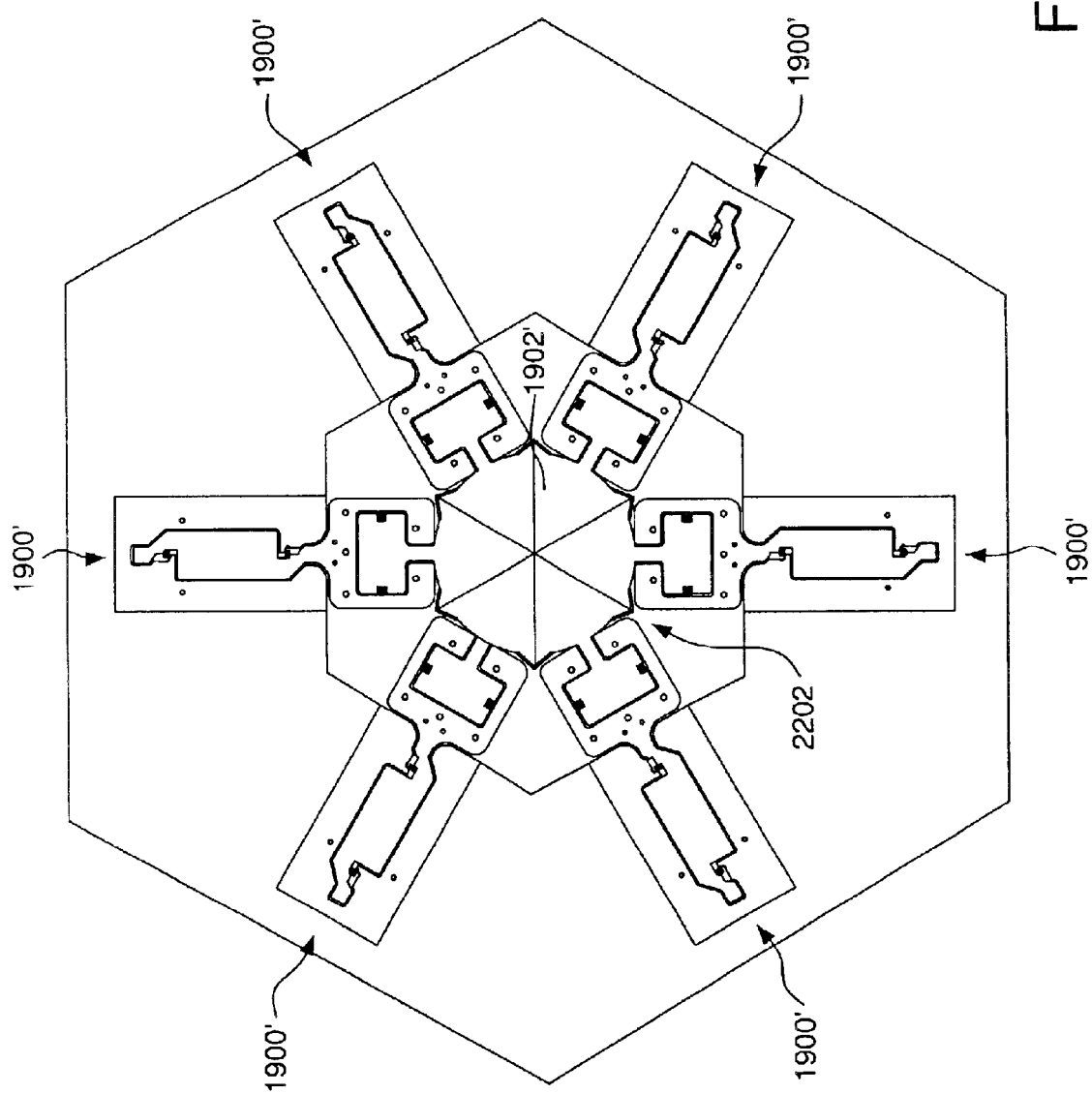
FIG. 22 illustrates an optical switch having six radially arrayed switches each of which is similar to the switch shown in FIG. 19 according to another embodiment of the invention.

FIG. 22 shows an arrayed switch 2200 according to another embodiment of the invention. Switch 2200 has six switches 1900', each of which is similar to switch 1900 of FIG. 19. One difference between switches 1900' and 1900 is that a triangular mirror 1902' is used in switch 1900' instead of rectangular mirror 1902 in switch 1900. Six switches 1900' are radially arrayed such that six mirrors 1902' form a segmented hexagonal mirror 2202 in switch 2200. In one configuration, segmented mirror 2202 of switch 2200 may be used as a beam splitter in an optical channel multiplexer. In a different embodiment, a segmented mirror having a different number of segments may be implemented using a different number of radially arrayed switches.

Figure 23A:
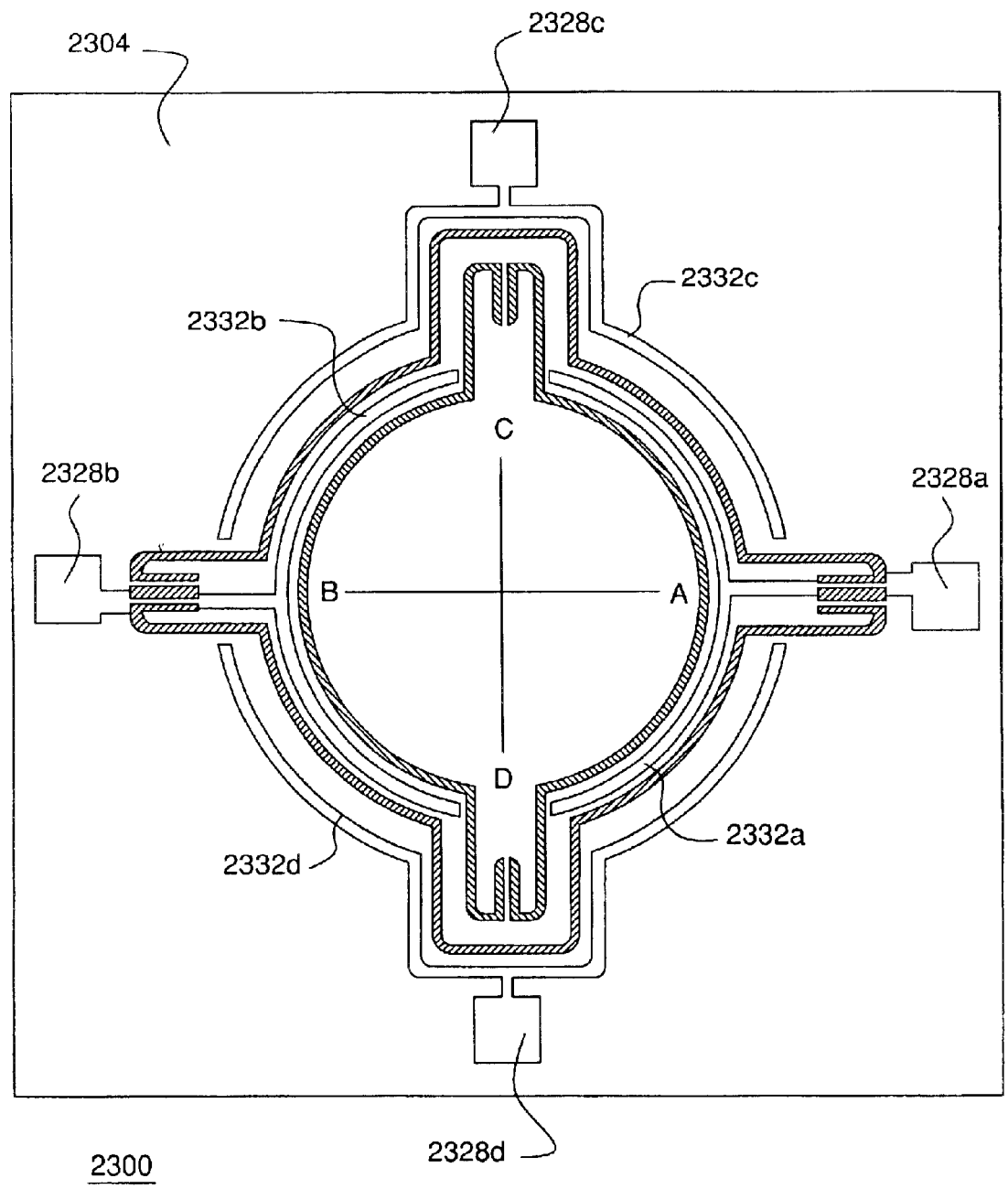
FIGS. 23A–B illustrate cross-sectional and top views, respectively, of a two-axis switch driven by fringe-field actuation according to a different embodiment of the invention.
Figure 23B:
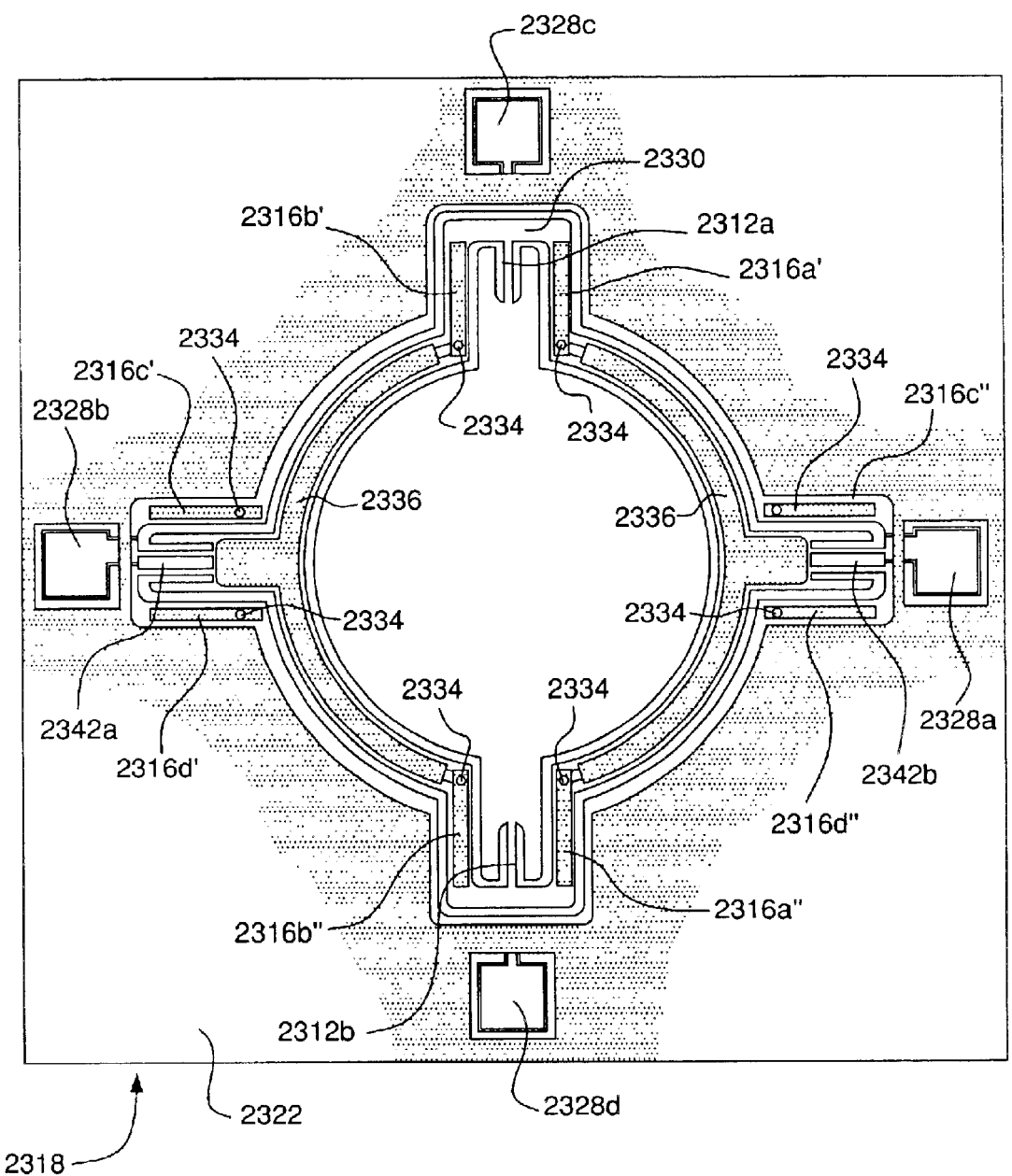

FIGS. 23A–B illustrate cross-sectional and top views, respectively, of a two-axis switch 2300 driven by fringe-field actuation according to a different embodiment of the invention. FIG. 23A illustrates the layout of a layer 2304 in switch 2300, which is analogous to layer 1904 in switch 1900 of FIG. 19, and FIG. 23B shows a top view of switch 2300.

In one embodiment, switch 2300 is implemented using a wafer 2318 that includes layer 2304 and is similar to, e.g., wafer 1918 of FIG. 19. Switch 2300 has a round movable mirror 2302 supported on wafer 2318 by a support structure including a gimbal 2330 and torsional members 2312*a–b* and 2342*a–b*. Members 2312*a–b* are connected between mirror 2302 and gimbal 2330 and members 2342*a–b* are connected between gimbal 2330 and the rest of layer 2304. Each torsional member 2342 has two split rods that are not in direct electrical contact with each other. As a result, each torsional member 2342 provides two independent electrical leads using a separate split rod for each lead.

Switch 2300 is configured with an FF actuator including mirror 2302, gimbal 2330, and four electrodes 2316*a–d*. Electrodes 2316*a–b* are connected to gimbal 2330 and are movable with the gimbal, whereas electrodes 2316*c–d* are connected to the rest of layer 2304 and are stationary. Each electrode 2316 has two split parts 2316' and 2316" oppositely located with respect to mirror 2302. Electrodes 2316*a–d* may be implemented using two additional layers 2320 and 2322 deposited over layer 2304 of wafer 2318. In one embodiment, layers 2320 and 2322 are analogous to layers 1920 and 1922, respectively, of switch 1900.

Switch 2300 further has conducting tracks 2332*a–d* configured to connect electrodes 2316*a–d* to corresponding contact pads 2328*a–d*. Tracks 2332*c–d* and pads 2328*a–d* are defined in layer 2304 using trenches etched in that layer and configured to electrically isolate those tracks and pads from the rest of layer 2304. Similarly, tracks 2332*a–b* are defined in gimbal 2330. In addition, tracks 2332*a–b* are formed such that a first split rod of each torsional member 2342*a–b* is connected between a terminal portion of each track 2332*a–b* and corresponding contact pad 2328*a–b*. A plurality of via structures 2334 are used to electrically connect tracks 2332 to corresponding electrodes 2316. Gimbal 2330 is electrically connected to the rest of layer 2304 through second split parts of members 2342*a–b* and mirror 2302 is electrically connected to gimbal 2330 through members 2312*a–b*. In one embodiment, switch 2300 may also have an optional dividing barrier 2336 connected to gimbal 2330 and movable with the gimbal. Barrier 2336 may be implemented similar to barrier 1936 in switch 1900 of FIG. 19 to provide electrical shielding between different electrodes 2316.

Gimbal 2330 and therefore mirror 2302 can be rotated about an axis defined by members 2342*a–b* and labeled AB in FIG. 23A. Mirror 2302 can also be rotated about a second axis defined by members 2312*a–b* and labeled CD in FIG. 23A. Electrodes 2316*c–d* enable bidirectional rotation of gimbal 2330 about axis AB, whereas electrodes 2316*a–b* enable bidirectional rotation of mirror 2302 about axis CD. Actuation of the bidirectional rotation about axes AB and CD in switch 2300 using electrodes 2316 is similar to that in switch 1900.

Figure 24:
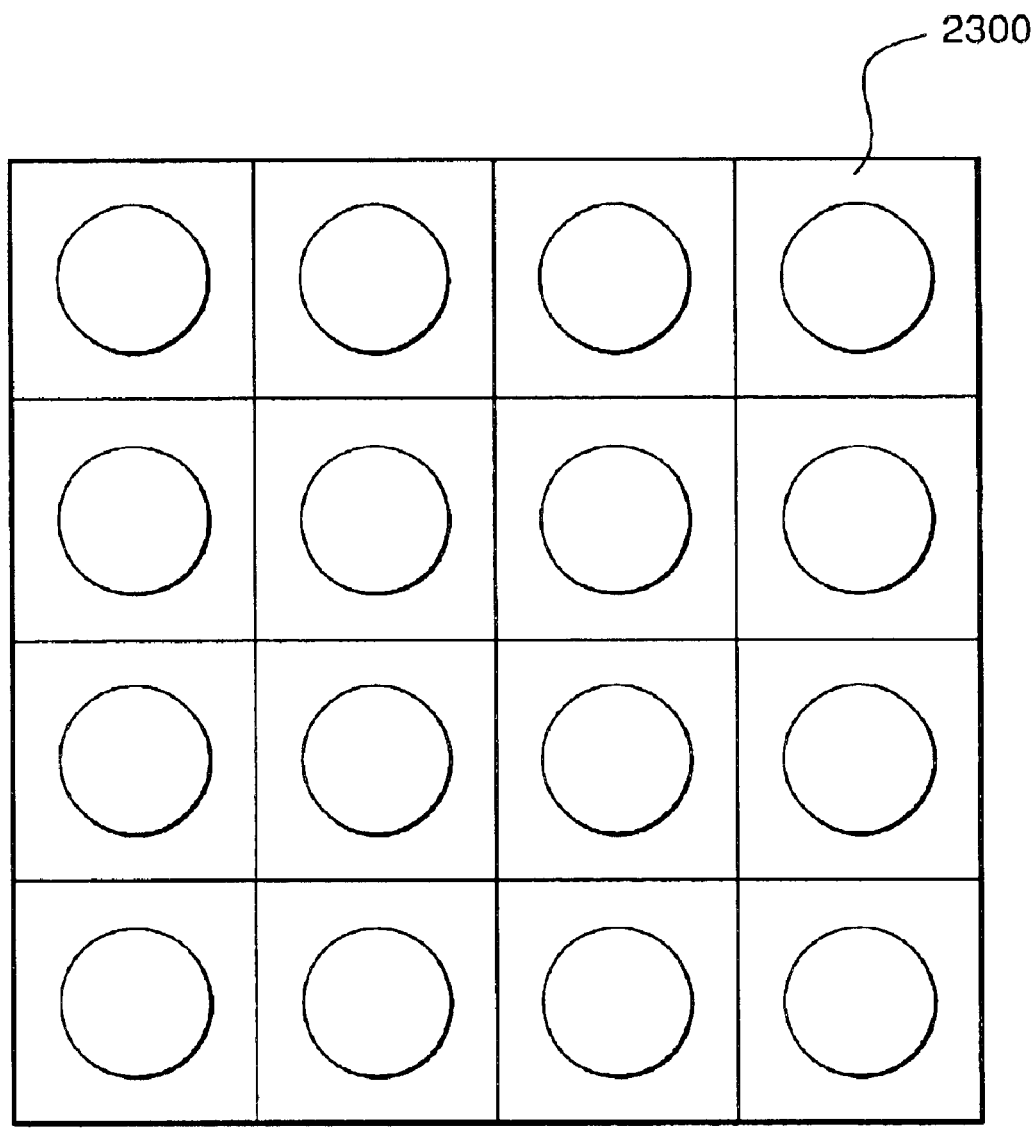
FIG. 24 illustrates an arrayed optical switch having sixteen optical switches of FIG. 23 according to one embodiment of the invention.

FIG. 24 illustrates an arrayed optical switch 2400 according to one embodiment of the invention. Switch 2400 has sixteen optical switches 2300 configured to provide a two-dimensional array of mirrors. Each switch 2300 of arrayed switch 2400 may be individually actuated using a separate set of driving voltages applied to the corresponding set of contact pads. In different embodiments, a different number of switches 2300 may be similarly arrayed.

Fabrication Techniques

Different techniques may be used to fabricate each of switches 200, 500, 700, 800, 900, 1000, 1201, 1301, 1401, 1600, 1800, 1900, or 2300 from an initial SOI wafer. For example, an etch fabrication method may be used. It is known that silicon etches significantly faster than silicon oxide using, e.g., reactive ion etching (RIE). Similarly, silicon oxide etches significantly faster than silicon using, e.g., fluorine-based etchants. Relatively deep cavities in a relatively thick substrate layer (e.g., layer 206 of FIG. 2) may be defined using a standard, anisotropic etching technique, such as deep RIE. Deep RIE stops automatically at the oxide layer (e.g., layer 208) acting as an etch stop.

Additional layers of material (e.g., layers 1020 and 1022 of FIG. 10) may be deposited onto an SOI wafer using, e.g., chemical vapor deposition. Various parts of the switches may be mapped onto the corresponding layers using lithography. Current lithographic techniques are capable of defining details whose size is as small as about 0.25 microns. Additional description of various fabrication steps may be found in above-cited U.S. Pat. No. 6,201,631 as well as in U.S. Pat. Nos. 5,629,790 and 5,501,893, the teachings of both of which are incorporated herein by reference.

Although fabrication of switches of the invention has been described in the context of using silicon/silicon oxide SOI wafers, other suitable materials, such as germanium-compensated silicon, may similarly be used. The materials may be appropriately doped as known in the art. Various surfaces may be modified, e.g., by metal deposition for enhanced reflectivity and/or electrical conductivity or by ion implantation for enhanced mechanical strength. Also, instead of a flat reflecting surface a curved or otherwise profiled surface may be used. In addition, differently shaped mirrors, plates, electrodes, barriers, and/or support structures may be implemented without departing from the scope and principle of the invention. Support structures may include one or more differently configured springs, where the term "spring" refers in general to any suitable elastic structure that can recover its original shape after being distorted. Furthermore, a different layout for conducting tracks may be realized as necessary and/or apparent to a person skilled in the art.

Although split serpentine springs (e.g., springs 1942) and split torsional members (e.g., members 2342) were described as having two split parts, a different number of split parts may be similarly implemented. A switch of the invention may be configured to achieve any angle within the working angle range based on the appropriate selection of voltage(s), thus possibly providing any desirable number of switch channels. Individual switches of the invention may be differently arrayed to provide linear, radial, or two-dimensional arrays of mirrors.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

I claim:

1. A MEMS device, comprising:
   a stationary part; and
   a movable part movably coupled to the stationary part, wherein:
   the movable part is adapted to move relative to the stationary part in response to a first voltage applied between the movable part and a first electrode rigidly connected to the stationary part;
   the MEMS device is formed in a single wafer; and
   the MEMS device is part of an integrated device having three or more MEMS devices that are radially arrayed with their respective movable parts forming different sections of a segmented plate, wherein said sections are arranged in a substantially contiguous pattern.

2. A MEMS device, comprising:
   a stationary part; and
   a movable part movably coupled to the stationary part, wherein:
   the movable part is adapted to move relative to the stationary part in response to a first voltage applied between a first electrode rigidly connected to the stationary part and a second electrode rigidly connected to the movable part;
   the first and second electrodes form a parallel-plate actuator; wherein, when the movable part moves with respect to the stationary part, the second electrode moves with respect to the first electrode without substantially changing an overlap area between said electrodes; and
   the MEMS device is formed in a single wafer, wherein the wafer comprises:
   a first layer;
   a second layer formed over the first layer; and
   a third layer formed over the second layer, wherein:
   the first electrode is formed in the first layer;
   the second layer electrically insulates the first layer from the third layer; and
   the movable part is formed in the third layer.

3. The invention of claim 2, wherein the first electrode is electrically isolated from the stationary part by a groove in the first layer.

4. The invention of claim 2, wherein the second electrode is formed in the first layer.

5. The invention of claim 2, wherein the movable part is adapted to move relative to the stationary part in response to a second voltage applied between the second electrode and a third electrode rigidly connected to the stationary part in the direction different from the motion imparted by the voltage applied between the first electrode and the second electrode.

6. A MEMS device, comprising:
   a stationary part; and
   a movable part movably coupled to the stationary part, wherein:
   the movable part is adapted to move relative to the stationary part in response to a first voltage applied between the movable part and a first electrode rigidly connected to the stationary part;
   the MEMS device is formed in a single wafer, wherein the wafer comprises:
   a first layer;
   a second layer formed over the first layer; and
   a third layer formed over the second layer, wherein:
   the first electrode is formed in the first layer;
   the second layer electrically insulates the first layer from the third layer; and
   the movable part is formed in the third layer; and
   the MEMS device is part of an integrated device having two or more MEMS devices that are radially arrayed with their respective movable parts forming different sections of segmented plate, wherein said sections are arranged in a substantially contiguous pattern.

7. The invention of claim 6, wherein the first electrode is electrically isolated from the stationary part by a groove in the first layer.

8. The invention of claim 6, wherein the movable part is adapted to move relative to the stationary part in response to the first voltage applied between the first electrode and a second electrode rigidly connected to the movable part.

9. The invention of claim 8, wherein the first and second electrodes form a parallel-plate actuator.

10. The invention of claim 8, wherein the first and second electrodes form a fringe-field actuator.

11. The invention of claim 6, wherein the movable part is adapted to move relative to the stationary part in response to a second voltage applied between the movable part and a second electrode rigidly connected to the stationary part in the direction different from the motion imparted by the voltage applied between the first electrode and the movable part.

12. The invention of claim 11, wherein a third electrode is rigidly connected to the movable part, the third electrode forming a different parallel-plate actuator with each of the first and second electrodes.

13. The invention of claim 11, wherein the station part comprises:

a first contact block electrically connected to the first electrode and adapted to receive a first bias potential; and a second contact block electrically connected to the second electrode and adapted to receive a second bias potential different from the first bias potential.

14. The invention of claim 6, wherein two springs are connected between the stationary part and the movable part on a single side of the movable part, which forms a cantilevered plate.

15. The invention of claim 6, wherein:

the movable part and the first electrode form a fringe-field actuator; and the movable part cannot come into physical contact with the first electrode during motion of the movable part relative to the stationary part.

16. The invention of claim 6, wherein the movable part has a reflective surface and the MEMS device is an element of an optical cross-connect having two or more MEMS devices.

17. A MEMS device, comprising:

a stationary part; and a movable part movably coupled to the stationary part, wherein:

two springs are connected between the stationary part and the movable part on opposite sides of the movable part the movable part is adapted to move relative to the stationary part in response to a first voltage applied between the movable part and a first electrode rigidly connected to the stationary part;

the MEMS device is formed in a single wafer; and the MEMS device is part of an integrated device having two or more MEMS devices that are radially arrayed with their respective movable parts forming different sections of a segmented plate, wherein said sections are arranged in a substantially contiguous pattern.

18. The invention of claim 17, wherein the movable part forms a balanced plate.

19. The invention of claim 17, wherein:

the movable part has a short end and a long end with respect to the two springs; and the first electrode is located adjacent to the short end of the movable part.

20. A MEMS device, comprising:

a stationary part; and a movable part movably coupled to the stationary part, wherein:

the movable part is adapted to move relative to the stationary part in response to a first voltage applied between a first electrode rigidly connected to the stationary part and a second electrode rigidly connected to the movable part;

the first and second electrodes form a parallel-plate actuator; wherein, when the movable part moves with respect to the stationary part, the second electrode moves with respect to the first electrode without substantially changing an overlap area between said electrodes;

the MEMS device is formed in a single wafer; and the movable part has a reflective surface and the MEMS device is an element of an optical cross-connect having two or more MEMS device.

* * * * *